US008803506B2

(12) United States Patent
Yanagisawa

(10) Patent No.: US 8,803,506 B2
(45) Date of Patent: Aug. 12, 2014

(54) VOLTAGE DETECTING APPARATUS THAT DETECTS VOLTAGE OF AN OBJECT

(75) Inventor: Koichi Yanagisawa, Ueda (JP)

(73) Assignee: Hioki Denki Kabushiki Kaisha, Nagano (JP)

(*) Notice: Subject to any disclaimer, the term of this patent is extended or adjusted under 35 U.S.C. 154(b) by 0 days.

(21) Appl. No.: 13/483,709

(22) Filed: May 30, 2012

(65) Prior Publication Data
US 2012/0235666 A1 Sep. 20, 2012

Related U.S. Application Data

(62) Division of application No. 12/485,188, filed on Jun. 16, 2009, now Pat. No. 8,222,886.

(30) Foreign Application Priority Data

Jun. 18, 2008 (JP) ................. 2008-158754
Apr. 23, 2009 (JP) ................. 2009-105324
Apr. 23, 2009 (JP) ................. 2009-105340
Apr. 30, 2009 (JP) ................. 2009-110302

(51) Int. Cl.
G01R 19/00 (2006.01)
G01R 15/16 (2006.01)

(52) U.S. Cl.
USPC .................. 324/76.11; 324/123 R

(58) Field of Classification Search
None
See application file for complete search history.

(56) References Cited

U.S. PATENT DOCUMENTS

| 3,007,116 | A | 10/1961 | Gerhard |
| 4,270,090 | A | 5/1981 | Williams |
| 4,625,176 | A | 11/1986 | Champion et al. |
| 4,797,620 | A | 1/1989 | Williams |
| 6,426,630 | B1* | 7/2002 | Werner, Jr. ............ 324/458 |
| 7,098,644 | B1* | 8/2006 | Denison ............... 324/72.5 |
| 7,466,145 | B2* | 12/2008 | Yanagisawa ........... 324/658 |
| 7,834,645 | B2 | 11/2010 | Yanagisawa |
| 2007/0108992 | A1 | 5/2007 | Yanagisawa |
| 2007/0164723 | A1 | 7/2007 | Yanagisawa |

FOREIGN PATENT DOCUMENTS

| JP | 56-055867 | 5/1981 |
| JP | 60-067866 | 4/1985 |
| JP | 62-201368 | 9/1987 |
| JP | 62-214368 | 9/1987 |
| JP | 63-106574 | 5/1988 |

(Continued)

OTHER PUBLICATIONS

English language Abstract of JP 1-214769, Aug. 29, 1989.

(Continued)

Primary Examiner — Vinh Nguyen
(74) Attorney, Agent, or Firm — Greenblum & Bernstein, P.L.C.

(57) ABSTRACT

A voltage detecting apparatus detects a detected AC voltage generated in a detected object. The voltage detecting apparatus includes a detection electrode that is disposed facing the detected object, and is capacitively coupled to the detected object. The voltage detecting apparatus also includes a bootstrap circuit that operates using a floating power supply generated with a reference voltage, and outputs a detection signal whose amplitude changes in accordance with an AC potential difference between the detected AC voltage and the reference voltage. The voltage detecting apparatus further includes an insulating circuit that inputs the detection signal and outputs an insulated detection signal that is electrically insulated from the detection signal, and a voltage generating circuit that amplifies the insulated detection signal to reduce the AC potential difference and generate the reference signal.

6 Claims, 14 Drawing Sheets

(56) References Cited

FOREIGN PATENT DOCUMENTS

| | | |
|---|---|---|
| JP | 6-201734 | 7/1994 |
| JP | 7-58297 | 6/1995 |
| JP | 09-138254 | 5/1997 |
| JP | 09-211046 | 8/1997 |
| JP | 10-300803 | 11/1998 |
| JP | 2002-040079 | 2/2002 |
| JP | 2002-055126 | 2/2002 |
| JP | 2002-162429 | 6/2002 |
| JP | 2007-147419 | 6/2007 |
| JP | 2007-212204 | 8/2007 |
| JP | 2008-051738 | 3/2008 |
| JP | 2008-261646 | 10/2008 |
| JP | 2010-25918 | 2/2010 |

OTHER PUBLICATIONS

Office Action, dated Jan. 29, 2013, from Japanese Patent Office (JPO) for Japanese Patent Application No. 2009-105324.

Japan Office Action, mailed Dec. 18, 2012, in related Japanese Patent Application No. 2008-185534.

Japan Office Action, mailed Jun. 25, 2013, in related Japanese Patent Application No. 2009-105340.

* cited by examiner

F I G. 6
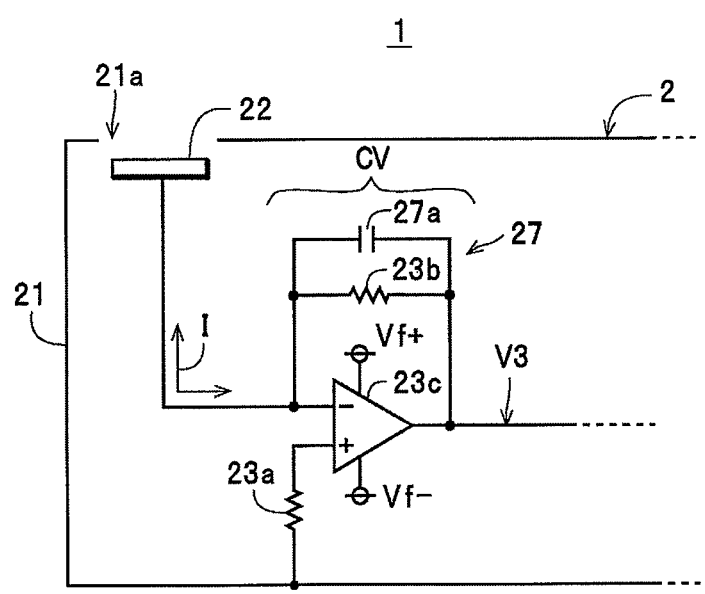

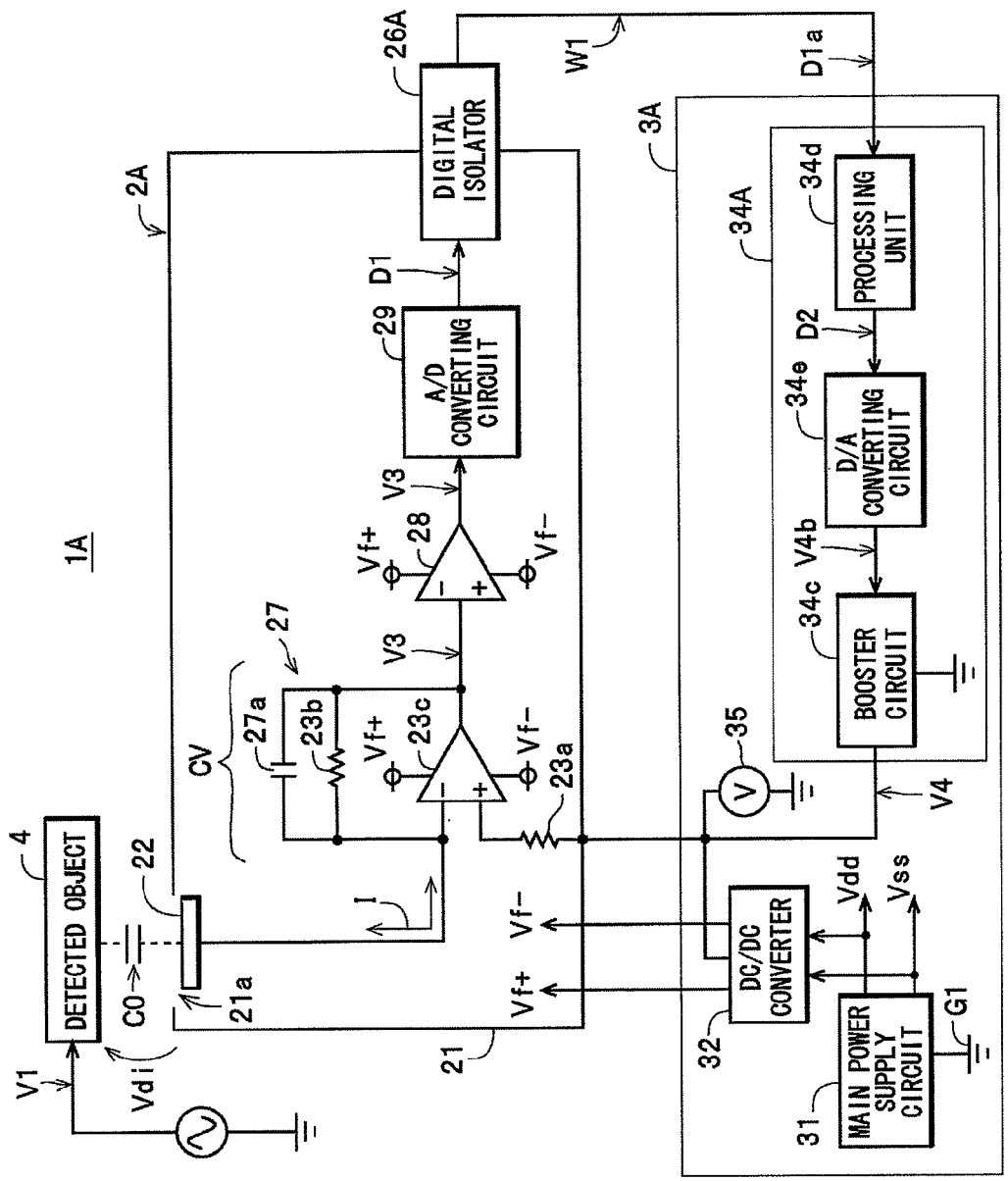
F I G. 7

F I G. 1 1
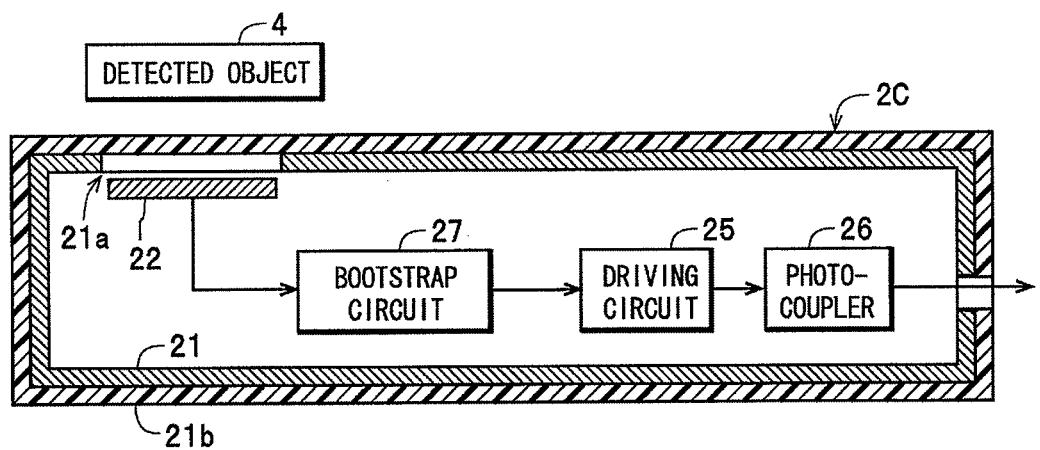
F I G. 1 2
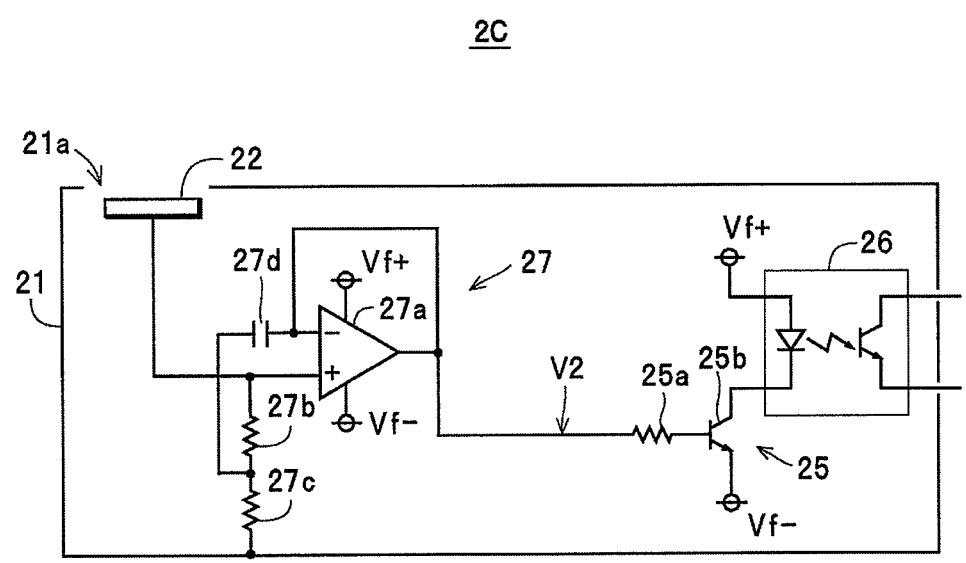

US 8,803,506 B2

VOLTAGE DETECTING APPARATUS THAT DETECTS VOLTAGE OF AN OBJECT

CROSS REFERENCE

This application is a divisional of application Ser. No. 12/485,188, filed Jun. 16, 2009, now U.S. Pat. No. 8,222,886, and which claims the benefit of Japanese Application JP2008-158754, filed Jun. 18, 2008, Japanese Application JP2009-110302, filed Apr. 30, 2009, Japanese Application JP2009-105340, filed Apr. 23, 2009, and Japanese Application JP2009-105324, filed Apr. 23, 2009. The disclosures of application Ser. No. 12/485,188, JP2008-158754, JP2009-110302, JP2009-105340, and JP2009-105324 are incorporated by reference herein in their entireties.

BACKGROUND OF THE INVENTION

1. Field of the Invention

The present invention relates to a voltage detecting apparatus that detects the voltage of a detected object and to a line voltage detecting apparatus equipped with such voltage detecting apparatus.

2. Description of the Related Art

As one example of this type of a voltage detecting apparatus, a non-contact voltage measuring apparatus (hereinafter, also referred to as a "voltage detecting apparatus") disclosed by Japanese Examined Patent Application Publication H07-58297 is known. This voltage detecting apparatus is a non-contact potential measuring apparatus that reads changes in potential of a detected object (or "sample") in a non-contact manner, and includes a metal prong with a pointed end, a feedback circuit that detects a field emission current or tunnel current via the metal prong and applies a voltage to the metal prong so as to keep such current constant, and a circuit that reads the voltage of the metal prong. With this voltage detecting apparatus, when the metal prong is held near the detected object, the feedback circuit carries out control over the voltage applied to the metal prong so as to keep the field emission current or tunnel current constant. Since the voltage of the metal prong at this time will follow the voltage of the detected object, by reading the voltage of the metal prong, it is possible to read (i.e., detect) changes in the voltage of the detected object. This voltage detecting apparatus is constructed using a current-to-voltage converter as part of the feedback circuit and converts the field emission current or tunnel current to a voltage signal using the current-to-voltage converter.

SUMMARY OF THE INVENTION

However, by investigating the voltage detecting apparatus described above, the present inventor found the following problems with such voltage detecting apparatus. With this voltage detecting apparatus, the metal prong whose voltage changes in keeping with the voltage of the detected object (or "sample") is directly connected to an input terminal of the current-to-voltage converter. This means that as a first problem, to make it possible to use the voltage detecting apparatus on a detected object with a high voltage, it is necessary to construct the current-to-voltage converter using an operational amplifier with a high withstand voltage, that is, an electronic component with a high withstand voltage, resulting in an increase in apparatus cost.

Also, in the voltage detecting apparatus described above, the metal prong to which the output of the feedback circuit is applied is connected to the current-to-voltage converter and since the input impedance of a current-to-voltage converter is normally low, the feedback circuit has a heavy load. Accordingly, as a second problem which should be solved, in the voltage detecting apparatus described above, due to the heavy load of the feedback circuit, although it will be possible for the voltage applied to the metal prong to follow the variations in the potential of the detected object when the change in potential of the detected object is slow (i.e., when the period of the variations is long), when the change in the potential of the detected object is fast (i.e., when the period of the variations is short), it will be difficult for the voltage applied to the metal prong to follow the variations in the potential of the detected object.

The present inventor has already proposed another non-contact voltage detecting apparatus (see Japanese Patent Application No. 2008-158754). This voltage detecting apparatus applies a voltage to a guard electrode of a floating circuit unit that includes a detection electrode that is capacitively-coupled to the detected object (or "measured object"). By carrying out feedback control to cause such voltage to follow the voltage of the detected object, the voltage of the detected object is detected.

However, by further investigating the voltage detecting apparatuses described above, the present inventor found that even if the second problem described above is solved, since such voltage detecting apparatuses are constructed so as to use feedback control, when the voltage of the detected object is an AC voltage (detected AC voltage) of a high frequency, due to the performance of the circuit elements in the voltage detecting apparatuses, the voltage generated by feedback control will not be able to reliably follow the voltage of the detected object, resulting in a problem (hereinafter "third problem") which should be solved that it is difficult to correctly detect the detected AC voltage.

The present invention was conceived to solve the first problem described above and it is a first object of the present invention to provide a (non-contact) voltage detecting apparatus and a line voltage detecting apparatus that are capable of detecting the voltage of a detected object with a high voltage while avoiding the use of electronic components with a high withstand voltage.

The present invention was also conceived to solve the second problem described above and it is a second object of the present invention to provide a wideband voltage detecting apparatus and a line voltage detecting apparatus that are capable of detecting a voltage of a detected object that changes quickly.

The present invention was also conceived to solve the third problem described above and it is a third object of the present invention to provide a non-contact voltage detecting apparatus and a line voltage detecting apparatus that are capable of detecting a detected AC voltage across a wider band.

To achieve the above first object, a first voltage detecting apparatus that detects a detected AC voltage generated in a detected object comprises: a detection electrode that is disposed facing the detected object; a current-to-voltage converting circuit including an operational amplifier that has a first input terminal set at a reference voltage and a second input terminal directly or indirectly connected to the detection electrode and that converts a detection current, which flows with a current value that corresponds to an AC potential difference between the detected AC voltage and the reference voltage on a path that includes the detection electrode and a feedback circuit connected to the second input terminal, to a detection voltage signal and outputs the detection voltage signal; an integrating circuit that integrates the detection voltage signal and outputs an integrated signal whose amplitude changes in accordance with the potential difference; an insulating circuit that is disposed so as to come one of before and after the integrating circuit, inputs one out of the detection voltage signal and the integrated signal, and outputs the inputted signal so as to be electrically insulated from an input side thereof; and a voltage generating circuit that amplifies a signal based on the integrated signal so as to reduce the potential difference and thereby generates the reference signal.

With the first voltage detecting apparatus, in a state where the detection electrode has been disposed facing the detected object, the current-to-voltage converting unit converts the detection current, which flows (via the capacitance formed between the detected object and the detection electrode and the detection electrode on a path that includes the detection electrode and the feedback circuit connected to the second input terminal) with a current value that corresponds to the potential difference between the detected AC voltage and the reference voltage to a detection voltage signal. The integrating circuit integrates the detection voltage signal (more specifically, the current that flows based on the potential difference between the detection voltage signal and the reference voltage) to generate an integrated signal whose amplitude changes in accordance with the potential difference between the voltage of the detection electrode and the AC voltage of the detected object. The insulating circuit that is disposed so as to come one of before and after the integrating circuit inputs one out of the detection voltage signal and the integrated signal and outputs so as to be electrically insulated from the input side thereof. The voltage generating circuit amplifies a signal based on the integrated signal so as to reduce the potential difference between the detected AC voltage and the reference voltage and thereby generates the reference voltage.

According to the first voltage detecting apparatus, since the magnitude of the capacitance is normally extremely small, it is possible to set the impedance between the detected object and the detection electrode at a sufficiently high value (several MO) and as a result, it is possible to set the input impedance of the current-to-voltage converting circuit at a relatively low value. This means that it becomes less likely that an overvoltage will be applied to the current-to-voltage converting circuit, and even if a low-cost electronic component (such as an operational amplifier) with a low input withstand voltage is used in the current-to-voltage converting circuit, it will still be possible to greatly reduce the probability of breakdown of the current-to-voltage converting circuit due to the potential difference between the detected AC voltage and the reference voltage. Also, by adding a protective circuit such as a diode, it is possible to reliably avoid breakdown.

To achieve the above first object, another first voltage detecting apparatus that detects a detected AC voltage generated in a detected object comprises: a detection electrode that is disposed facing the detected object; a current-to-voltage converting circuit including a detection unit that is disposed between the detection electrode and a position of a reference voltage and converts a detection current, which flows with a current value that corresponds to an AC potential difference between the detected AC voltage and the reference voltage, to a voltage signal and an amplifier that converts an impedance of the voltage signal and outputs the converted voltage signal as a detection voltage signal; an integrating circuit that integrates the detection voltage signal and outputs an integrated signal whose amplitude changes in accordance with the potential difference; an insulating circuit that is disposed so as to come one of before and after the integrating circuit, inputs one out of the detection voltage signal and the integrated signal, and outputs the inputted signal so as to be electrically insulated from an input side thereof; and a voltage generating circuit that amplifies a signal based on the integrated signal so as to reduce the potential difference and thereby generates the reference signal.

According to this other first voltage detecting apparatus, since it is possible to set the input impedance of the current-to-voltage converting circuit at a relatively low value in the same way as in the first voltage detecting apparatus described above, it becomes less likely that an overvoltage will be applied and it becomes possible to greatly reduce the probability of breakdown of the current-to-voltage converting circuit due to the potential difference between the detected AC voltage and the reference voltage.

To achieve the above first object, another first voltage detecting apparatus that detects a detected AC voltage generated in a detected object comprises: a detection electrode that is disposed facing the detected object; an integrating circuit including an operational amplifier that has a first input terminal set at a reference voltage and a second input terminal directly or indirectly connected to the detection electrode and that integrates a detection current, which flows with a current value that corresponds to an AC potential difference between the detected AC voltage and the reference voltage on a path that includes the detection electrode and a feedback circuit connected to the second input terminal and outputs the integrated signal whose amplitude changes in accordance with the potential difference; an insulating circuit that inputs the integrated signal and outputs the inputted integrated signal so as to be electrically insulated from an input side thereof; and a voltage generating circuit that amplifies a signal based on the integrated signal so as to reduce the potential difference and thereby generates the reference signal.

According to this other first voltage detecting apparatus, since it is possible to set the input impedance of the current-to-voltage converting circuit at a relatively low value in the same way as in the first voltage detecting apparatus described above, it becomes less likely that an overvoltage will be applied and it becomes possible to greatly reduce the probability of breakdown of the integrating circuit due to the potential difference between the detected AC voltage and the reference voltage.

In the first voltage detecting apparatuses described above, the insulating circuit may include an optical insulating element and/or a transformer, and output the integrated signal, which is an analog signal, so as to be electrically insulated from the input side thereof.

By using this construction, it becomes easy to electrically insulate (separate) the current-to-voltage converting circuit and the following circuitry at an arbitrary position. Also, when an optical insulating element is used, since there are favorable frequency characteristics over a wide range of frequencies, it is possible to precisely detect the AC voltage of the detected object over a wide range of frequencies. When a transformer is used as the insulating circuit, since a transformer normally has favorable frequency characteristics in a higher frequency band than an optical insulating element, when the frequency of the AC voltage is limited to a high frequency, by using a transformer, it is possible to precisely detect the AC voltage. When the insulating circuit is constructed by connecting an optical insulating element and a transformer in parallel, by having the optical insulating element operate mainly at low frequencies and the transformer operate mainly at high frequencies, it is possible to provide the insulating circuit with favorable frequency characteristics over a wide frequency band. As a result, it is possible to detect the AC voltage of the detected object precisely over a significantly wider range of frequencies.

In the first voltage detecting apparatuses described above, the insulating circuit may include a digital isolator, and output the integrated signal, which is a digital signal, so as to be electrically insulated from the input side thereof.

By using this construction, it is possible to transmit a signal with high precision to the voltage generating circuit without being affected by the temperature, changes over time, and the like of the transfer path on which an electrically insulated signal is transferred. As a result, it is possible to significantly improve the detection precision of the detected AC voltage.

The first voltage detecting apparatuses described above may further comprise a guard electrode that is set at the reference voltage and cover circuits from a circuit that comes after the detection electrode to a primary-side circuit of the insulating circuit.

By using this construction, it is possible to make the circuits less susceptible to the effects of external magnetic fields, and as a result, it is possible to improve the detection precision of the detected AC voltage.

In this case, an opening may be formed in the guard electrode and the detection electrode may be disposed at a position inside the guard electrode so as to face the opening in a state where the detection electrode does not protrude from the opening.

By disposing the detection electrode in a state where the detection electrode is inside the guard electrode at a position that faces an opening formed in the guard electrode without the detection electrode protruding from the opening (a "non-protruding state"), it is possible to make the detection electrode less susceptible to the effects of the external magnetic fields. As a result, it is possible to significantly improve the detection precision of the detected AC voltage.

The first voltage detecting apparatuses described above may further comprise an insulator that covers an entire surface of the detection electrode that faces the detected object.

By using the above construction, it is possible to reliably prevent shorting between the detected object and the detection electrode.

A first line voltage detecting apparatus comprises: a plurality of first voltage detecting apparatuses that are constructed so that the detection electrodes thereof are capable of being disposed facing a plurality of paths that correspond to the detected objects thereof and so as to be capable of detecting AC voltages generated on the respective paths as the detected AC voltages thereof; and a calculation unit that calculates a voltage difference between the AC voltages on two of the paths detected by a pair of first voltage detecting apparatuses out of the plurality of first voltage detecting apparatuses and thereby finds a line voltage between the two paths.

According to the first line voltage detecting apparatus, by using the first voltage detecting apparatus described above, even if low-cost electronic components (such as operational amplifiers) with a low input withstand voltage are used in the current-to-voltage converting circuits of the respective voltage detecting apparatuses, it will still be possible to avoid breakdown of the current-to-voltage converting circuits due to the potential difference between the detected AC voltages and the reference voltages. This means that it is possible to detect line voltages while reducing the apparatus cost.

To achieve the second object, a second voltage detecting apparatus that detects a detected AC voltage generated in a detected object comprises: a detection electrode that is disposed facing the detected object and is capacitively coupled to the detected object; a bootstrap circuit that operates using a floating power supply generated with a reference voltage as a reference and outputs a detection signal whose amplitude changes in accordance with an AC potential difference between the detected AC voltage and the reference voltage; an insulating circuit that inputs the detection signal and outputs an insulated detection signal that is electrically insulated from the detection signal; and a voltage generating circuit that amplifies the insulated detection signal so as to reduce the potential difference and thereby generates the reference signal.

In this second voltage detecting apparatus, in a state where the detection electrode has been positioned facing the detected object, the bootstrap circuit outputs the detection signal that is based on, and whose amplitude changes in accordance with, the potential difference between the AC voltage and the reference voltage. The insulating circuit outputs the detection signal as the insulated detection signal that is electrically insulated from the detection signal. The voltage generating circuit amplifies the insulated detection signal to generate the reference voltage. In this voltage detecting apparatus, since the circuit connected to the detection electrode is the bootstrap circuit that has an extremely high input impedance, the impedance of the detection electrode is kept at a high impedance and the impedance of the floating circuit unit as a whole that acts as a load of the voltage generating circuit also becomes a high impedance (that is, the load of the voltage generating circuit is light).

This means that according to the second voltage detecting apparatus, the voltage generating circuit can cause the outputted reference voltage to favorably follow a detected AC voltage with a short period (i.e., a high frequency), and as a result, it is possible to precisely detect the detected AC voltage across a wide frequency band.

In the second voltage detecting apparatus, the insulating circuit may include an optical insulating element and/or a transformer, and output the detection signal, which is an analog signal, so as to be electrically insulated from the input side thereof.

By using this construction, it becomes easy to electrically insulate (separate) the bootstrap circuit and the main circuit unit. Also, since the frequency characteristics are favorable over a wide range of frequencies when an optical insulating element is used, it is possible to precisely detect the AC voltage of the detected object over a wide range of frequencies. Also, when a transformer is used as the insulating circuit, since a transformer normally has favorable frequency characteristics at a higher frequency band than an optical insulating element, it is possible to increase a maximum frequency of a frequency band where the detected AC voltage can be detected. When the insulating circuit is constructed by connecting an optical insulating element and a transformer in parallel, by having the optical insulating element operate mainly at low frequencies and the transformer operate mainly at high frequencies, it is possible to provide the insulating circuit with favorable frequency characteristics over a significantly wider frequency band. As a result, it is possible to detect the AC voltage of the detected object with higher precision over a wide range of frequencies.

The second voltage detecting apparatus may further comprise a guard electrode set at the reference voltage, and the bootstrap circuit and a primary-side circuit of the insulating circuit are covered by the guard electrode.

By using this construction, it is possible to make the circuits less susceptible to the effects of external magnetic fields, and as a result, it is possible to improve the detection precision of the detected AC voltage.

In the second voltage detecting apparatus, an opening may be formed in the guard electrode and the detection electrode may be disposed at a position inside the guard electrode so as to face the opening in a state where the detection electrode does not protrude from the opening.

By disposing the detection electrode in a state where the detection electrode is inside the guard electrode at a position that faces an opening formed in the guard electrode without protruding from the opening (a "non-protruding state"), it is possible to make the detection electrode less susceptible to the effects of external magnetic fields. As a result, it is possible to significantly improve the detection precision of the detected AC voltage.

The second voltage detecting apparatus may further comprise an insulator that covers an entire surface of the detection electrode that faces the detected object.

By using this construction, it is possible to reliably prevent shorting between the detected object and the detection electrode.

A second line voltage detecting apparatus comprises: a plurality of second voltage detecting apparatuses that are constructed so that the detection electrodes thereof are capable of being disposed facing a plurality of paths that correspond to the detected objects thereof and so as to be capable of detecting AC voltages generated on the respective paths as the detected AC voltages thereof; and a calculation unit that calculates a voltage difference between the AC voltages on two of the paths detected by a pair of second voltage detecting apparatuses out of the plurality of second voltage detecting apparatuses and thereby finds a line voltage between the two paths.

According to this second line voltage detecting apparatus, by using the second voltage detecting apparatuses that include the bootstrap circuits, it is possible to precisely detect the AC voltages of the paths across a wide frequency band. This means it is also possible to precisely measure the respective line voltages across a wide frequency band.

To achieve the third object, a third voltage detecting apparatus that detects a detected AC voltage generated in a detected object comprises: a detection electrode that is disposed facing the detected object and is capacitively coupled to the detected object; a detection unit that operates on a floating power supply generated with a voltage of a reference voltage unit as a reference and outputs a detection signal whose amplitude changes in accordance with an AC potential difference between the detected AC voltage and the voltage of the reference voltage unit; a standard signal outputting unit that outputs a standard signal to the reference voltage unit; an insulating unit that inputs the detection signal and outputs an insulated detection signal that is electrically insulated from the detection signal; a feedback control unit that amplifies the insulated detection signal so as to reduce the potential difference and thereby generates a feedback voltage and outputs the feedback voltage to the reference voltage unit; and a signal extracting unit that amplifies the insulated detection signal by a predetermined gain to generate an amplified detection signal and, by controlling the gain so that a first signal component of the standard signal included in the amplified detection signal and a second signal component of the standard signal included in a reference signal based on the voltage of the reference voltage unit become capable of canceling one another out when the amplified detection signal and the reference signal are subjected to one of addition and subtraction, also generates a signal component of the detected AC voltage from the amplified detection signal and the reference signal and outputs the signal component as an output signal.

According to the third voltage detecting apparatus, the standard signal outputting unit outputs the standard signal to the reference voltage unit, and the detection unit that operates on a floating power supply outputs the detection signal whose amplitude changes in accordance with the AC potential difference between the detected AC voltage and the voltage of the reference voltage unit, and the insulating unit inputs the detection signal and outputs the insulated detection signal. Based on the insulated detection signal, the feedback control unit generates the feedback voltage so as to follow the detected AC voltage and outputs the feedback voltage to the reference voltage unit. The signal extracting unit controls the amplitude of the insulated detection signal so that the amplitude of the first signal component of the standard signal included in the generated amplified detection signal becomes equal to the amplitude of the second signal component of the standard signal included in the reference signal, outputs the result as the amplified detection signal, and also adds the amplified detection signal whose amplitude has been controlled in this way and the reference signal. By doing so, the signal extracting unit generates a signal component of the detected AC voltage from which the same signal component as the standard signal has been removed and outputs the generated signal component as the output signal.

According to the third voltage detecting apparatus, since it is possible to detect, based on the amplified detection signal generated by the signal extracting unit, a detected AC voltage in a high frequency band that could not be detected by the detection operation carried out by the feedback control unit alone, it becomes possible to detect the detected AC voltage in a non-contact manner across a wider frequency band. Also, according to this voltage detecting apparatus, since it is possible to detect the output signal without being affected by the coupled capacitance (capacitance) between the detected object and the detection electrode, it is possible to detect the AC voltage in a non-contact manner without calculating the capacitance.

The third voltage detecting apparatus may further comprise a judging unit that detects a level of a signal component of the standard signal included in one signal out of the insulated detection signal and the amplified detection signal and carries out at least one out of a judging process that judges that the voltage detecting apparatus is operating normally when the detected level is equal to or above a set level and a judging process that judges that the voltage detecting apparatus is operating abnormally when the detected level is below the set level.

With this construction, since it is possible to carry out self-diagnosis as to whether the apparatus is operating normally based on the level of the signal component of the standard signal included in one signal out of the insulated detection signal and the amplified detection signal, it is possible to improve the reliability of the apparatus.

In the third voltage detecting apparatus, the signal extracting unit may include: an amplifier circuit that amplifies the insulated detection signal by the gain to generate the amplified detection signal; a synchronous detection circuit that detects a wave detection signal showing an amplitude of the signal component of the standard signal included in one of the amplified detection signal and the output signal by carrying out synchronous detection using the standard signal; and a control circuit that controls the gain of the amplifier circuit based on the wave detection signal.

With this construction, since it is possible to accurately detect the signal component of the standard signal by carrying out synchronous detection, the signal component of the standard signal included in the amplified detection signal can be cancelled out with high precision. By doing so, it is possible to greatly reduce the signal component of the standard signal included in the output signal. As a result, it is possible to significantly improve the detection precision of the detected AC voltage.

The third voltage detecting apparatus may further comprise a judging unit that detects one level out of a level of a signal component of the standard signal included in the output signal and a level of the wave detection signal and carries out at least one out of a judging process that judges that the voltage detecting apparatus is operating normally when the detected level is equal to or below a set level and a judging process that judges that the voltage detecting apparatus is operating abnormally when the detected level is above the set level.

With this construction, since it is possible to carry out self-diagnosis as to whether the apparatus is operating normally based on one level out of the level of the signal component of the standard signal included in the output signal and the level of the wave detection signal, it is possible to improve the reliability of the apparatus.

In the third voltage detecting apparatus, the signal extracting unit may include one of an adder circuit that cancels out the first signal component and the second signal component by carrying out the addition and outputs the output signal and a subtractor circuit that cancels out the first signal component and the second signal component by carrying out the subtraction and outputs the output signal.

With this construction, it is possible to cancel out the first signal component and the second signal component of the standard signal and output the output signal with a circuit that can be easily constructed using an adder circuit or a subtractor circuit. Accordingly, it is possible to reliably generate the output signal while simplifying the apparatus construction.

The third voltage detecting apparatus may further comprise a processing unit that detects the detected AC voltage based on the output signal.

With this construction, it is possible for example to have the processing unit detect the detected AC voltage at fixed intervals and/or have a display apparatus or the like display the detected AC voltage as a waveform, thereby increasing convenience for the operator.

In the third voltage detecting apparatus, the processing unit may calculate a voltage of the detected AC voltage based on the output signal.

With this construction, since it is possible for the processing unit to calculate the voltage of the detected AC voltage based on the output signal, it is possible to accurately detect (measure) the detected AC voltage.

The third voltage detecting apparatus may further comprise an amplitude converting unit that converts an amplitude of the reference signal and outputs the reference signal with the converted amplitude to the signal extracting unit, and the signal extracting unit may control the gain so that the first signal component and the second signal component included in the reference signal with the converted amplitude are capable of canceling one another out.

With this construction, by multiplying the amplitude of the output signal that is composed of a signal component of the detected AC voltage by 1/k (where k is the ratio of the amplitude of the standard signal after conversion to the amplitude of the standard signal before conversion), it is possible to detect the detected AC voltage. Accordingly by changing the ratio k, it is possible to increase the detection range of the detected AC voltage.

A third line voltage detecting apparatus comprises: a plurality of third voltage detecting apparatuses that are constructed so that the detection electrodes thereof are capable of being disposed facing a plurality of paths that correspond to the detected objects thereof and so as to be capable of detecting AC voltages generated on the respective paths as the detected AC voltages thereof; and a calculation unit that calculates a voltage difference between the AC voltages on two of the paths detected by a pair of third voltage detecting apparatuses out of the plurality of third voltage detecting apparatuses and thereby finds a line voltage between the two paths.

According to the third line voltage detecting apparatus, by using the voltage detecting apparatus described above, even when the coupled capacitances between the paths that are the detected objects and the detection electrodes corresponding to such paths are unknown, it will still be possible to accurately detect the line voltages between the paths in a non-contact manner across a wider frequency band without calculating the coupled capacitances (capacitances) between the paths and the detection electrodes.

It should be noted that the disclosure of the present invention relates to the contents of Japanese Patent Application 2008-158754 that was filed on 18 Jun. 2008, Japanese Patent Application 2009-105324 that was filed on 23 Apr. 2009, Japanese Patent Application 2009-105340 that was filed on 23 Apr. 2009, and Japanese Patent Application 2009-110302 that was filed on 30 Apr. 2009, the entire contents of which are herein incorporated by reference.

BRIEF DESCRIPTION OF THE DRAWINGS

These and other objects and features of the present invention will be explained in more detail below with reference to the attached drawings, wherein:

FIG. 6 is a circuit diagram showing the construction of another current-to-voltage converting unit;

FIG. 7 is a block diagram showing the construction of another first voltage detecting apparatus;

FIG. 11 is a schematic cross-sectional view taken along a line W-W in FIG. 2 for use in explaining the construction of the floating circuit unit;

FIG. 12 is a circuit diagram showing another construction of a bootstrap circuit;

DESCRIPTION OF THE PREFERRED EMBODIMENTS

Preferred embodiments of a voltage detecting apparatus and a line voltage detecting apparatus will now be described with reference to the attached drawings.

First Embodiment

First, a voltage detecting apparatus (first voltage detecting apparatus) 1 according to the present embodiment will now be described with reference to the drawings.

Figure 1:
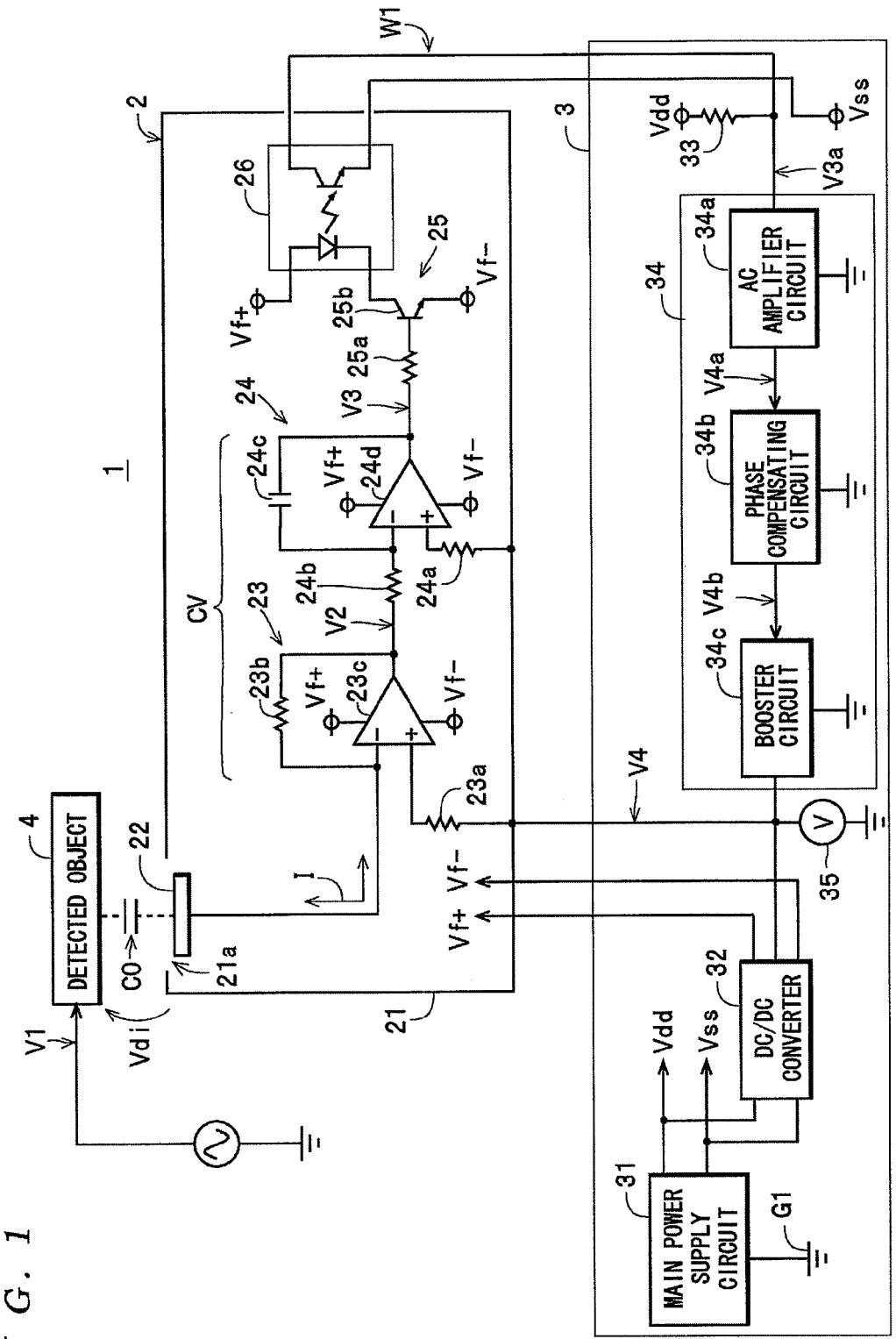
FIG. 1 is a block diagram showing the construction of a first voltage detecting apparatus.

The voltage detecting apparatus 1 is a non-contact voltage detecting apparatus, includes a floating circuit unit 2 and a main circuit unit 3 as shown in FIG. 1, and is constructed so as to be capable of detecting (measuring) an AC voltage V1 (detected AC voltage) generated in a detected object (measured object) 4 in a non-contact manner.

Figure 2:
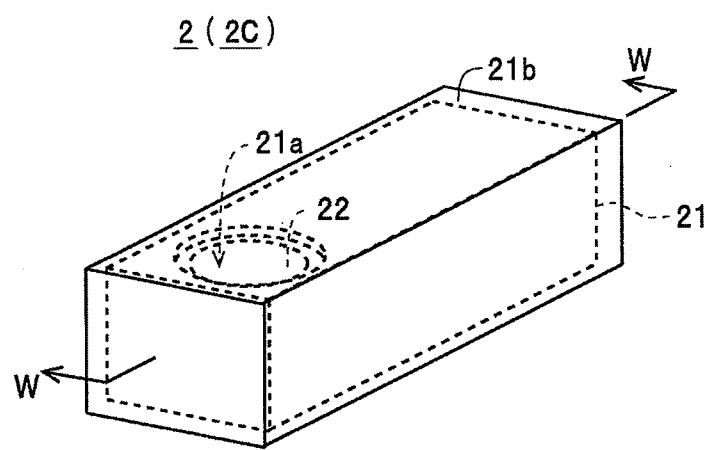
FIG. 2 is a perspective view of the floating circuit unit appearing in FIGS. 1 and 10.
Figure 3:
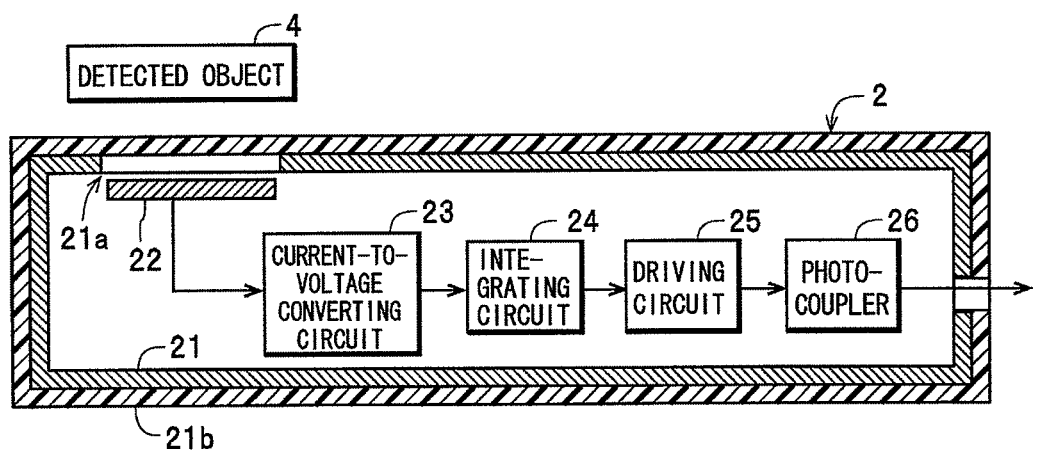
FIG. 3 is a schematic cross-sectional view taken along a line W-W in FIG. 2 for use in explaining the construction of the floating circuit unit.

As shown in FIGS. 1 to 3, the floating circuit unit 2 includes a guard electrode 21, a detection electrode 22, a current-to-voltage converting unit CV, a driving circuit 25, and an insulating circuit 26. As one example in the present embodiment, the current-to-voltage converting unit CV includes a current-to-voltage converting circuit 23 and an integrating circuit 24. Also as one example in the present embodiment, the insulating circuit 26 is constructed of a photocoupler (and is hereinafter also referred to as the "photocoupler 26"). The guard electrode 21 is constructed using a conductive material (as one example, a metal material), functions as a reference voltage unit in the floating circuit unit 2, and as one example encloses the circuits from the circuit following the detection electrode 22 to the insulating circuit 26, that is, the current-to-voltage converting circuit 23, the integrating circuit 24, the driving circuit 25, and the photocoupler 26. By doing so, the circuits from the current-to-voltage converting circuit 23 to the photocoupler 26 are covered by the guard electrode 21. Note that the parts to be covered by the guard electrode 21 may be a range from the circuit that follows the detection electrode 22 (i.e., a circuit connected to the detection electrode 22, in the present embodiment the current-to-voltage converting circuit 23) to a primary-side circuit of the photocoupler 26 (a light emitting diode, described later). This means that it is also possible to use a construction where a secondary-side circuit (a phototransistor, described later) of the photocoupler 26 is not covered by the guard electrode 21. As one example, when an optical insulating element such as a photocoupler 26 constructed so that the primary-side circuit and the secondary-side circuit are sealed in a single package using a resin material is used, the photocoupler 26 is disposed with respect to the guard electrode 21 so that the part included in the primary-side circuit of the package (i.e., the light-emitting diode-side half of the package) is positioned inside the guard electrode 21 and the part included in the secondary-side circuit (i.e., the phototransistor-side half of the package) projects outside (i.e., is exposed to) the periphery of the guard electrode 21. An opening (hole) 21a is also formed in the guard electrode 21, and in the present embodiment, as shown in FIGS. 2 and 3, the entire guard electrode 21 is covered by an insulating layer (one example of an insulator) 21b. As one example, the detection electrode 22 is formed in a plate-like shape and is disposed inside the guard electrode 21 at a position facing the opening 21a so as to not protrude out of the guard electrode 21 from the opening 21a (that is, a non-protruding state where the surface of the detection electrode 22 is withdrawn from the surface of the guard electrode 21). Since a construction is used where the entire guard electrode 21 is covered by the insulating layer 21b and the detection electrode 22 is disposed at a position facing the opening 21a, the insulating layer 21b covers the entire surface of the detection electrode 22 that faces the detected object 4.

As one example, as shown in FIG. 1, the current-to-voltage converting circuit 23 includes a first operational amplifier 23c with a non-inverted input terminal ("first input terminal") connected via a resistor 23a to the guard electrode 21 and an inverted input terminal ("second input terminal") connected to the detection electrode 22, and also includes a resistor 23b connected between the inverted input terminal and an output terminal of the first operational amplifier 23c as a feedback circuit. The first operational amplifier 23c of the current-to-voltage converting circuit 23 is driven by being supplied with a positive voltage Vf+ and a negative voltage Vf−, described later. The first operational amplifier 23c converts a detection current (hereinafter, "current signal") I flowing between the detected object 4 and the detection electrode 22 (more specifically, on a path between the detection electrode 22 and the resistor 23b) to a detection voltage signal V2 and outputs the detection voltage signal V2. The current signal I has a current value that corresponds to a potential difference Vdi between an AC voltage V1 of the detected object 4 and a voltage (hereinafter "reference voltage") of the guard electrode 21, or in other words, an AC potential difference, that is, a potential difference between an AC component of the AC voltage V1 and an AC component of the reference voltage. In this case, the amplitude of the detection voltage signal V2 changes in proportion to the amplitude of the current signal I.

As one example, the integrating circuit 24 is constructed so as to include a second operational amplifier 24d with a non-inverted input terminal connected via the resistor 24a to the guard electrode 21 and an inverted input terminal connected via an input resistor 24b to an output terminal of the first operational amplifier 23c, and also includes a capacitor 24c connected between the inverted input terminal and an output terminal of the second operational amplifier 24d as a feedback circuit. In the integrating circuit 24, the second operational amplifier 24d operates by being supplied with the positive voltage Vf+ and the negative voltage Vf− and integrates the detection voltage signal V2 to generate and output an integrated signal V3 whose voltage value changes in proportion to the potential difference Vdi between the AC voltage V1 of the detected object 4 and the voltage (reference voltage) of the guard electrode 21. Note that in place of the construction described above, the integrating circuit 24 may be constructed of a low pass filter.

Like the photocoupler 26, the driving circuit 25 is disposed so as to come after the integrating circuit 24 and is disposed between the integrating circuit 24 and a voltage generating circuit 34. As one example, the driving circuit 25 is constructed of a transistor (as one example in the present embodiment, an NPN bipolar transistor) 25b with a base terminal connected to an output terminal of the second operational amplifier 24d via an input resistor 25a, a collector terminal connected to the photocoupler 26, and an emitter terminal connected to the negative voltage Vf−. The photocoupler 26 is included in the concept of an "optical insulating element" that is one example of an insulating circuit. A cathode terminal of a light-emitting diode that is a primary-side circuit of the photocoupler 26 is connected to a collector terminal of the transistor 25b and an anode terminal is connected to the positive voltage Vf+. The phototransistor as the secondary-side circuit of the photocoupler 26 is connected via wires W1 to the main circuit unit 3. With this construction, by driving the photocoupler 26 using the driving circuit 25 so as to operate in a linear region, the resistance value of the phototransistor of the photocoupler 26 will change in accordance with (substantially proportionally to) the voltage value of the integrated signal V3. Accordingly, together with a resistor 33 of the main circuit unit 3, described later, the photocoupler 26 converts the integrated signal V3 that is an analog signal inputted from the integrating circuit 24 to an integrated signal Via that is a new analog signal and is electrically insulated from the integrated signal V3. Also, in place of the photocoupler 26, it is also possible to use an optical MOS-FET that is also an optical insulating element. In such case, the light-emitting diode as the primary-side circuit of the optical MOS-FET is connected to the transistor 25b and the like in the same way as the light-emitting diode of the photocoupler 26, and a FET pair as the secondary-side circuit is connected to the main circuit unit 3 via the wires W1.

As shown in FIG. 1, as one example, the main circuit unit 3 includes a main power supply circuit 31, a DC/DC converter (hereinafter simply "converter") 32, a current-to-voltage converting resistor 33, the voltage generating circuit 34, and a voltmeter 35. As one example, the main power supply circuit 31 is equipped with a battery and generates a positive voltage Vdd and a negative voltage Vss for driving the component elements 32, 34 of the main circuit unit 3 (i.e., DC voltages with respectively different polarities but with equal absolute values generated with ground G1 potential as a reference) from a DC voltage of the battery and outputs the voltages Vdd and Vss. As one example, the converter 32 includes an insulated transformer that includes a primary coil and a secondary coil that are electrically insulated from one another, a driving circuit that drives the primary coil of the transformer, and a DC converting unit that rectifies and smoothes an AC voltage that is induced in the secondary coil of the transformer (none of such component elements is shown), and is constructed as an insulated power supply where the secondary side is electrically insulated from the primary side. In the converter 32, the driving circuit operates based on the inputted positive voltage Vdd and the negative voltage Vss, and the primary coil of the transformer to which the positive voltage Vdd is applied is driven to induce an AC voltage in the secondary coil. The DC converting unit rectifies and smoothes such AC voltage. By doing so, the voltages mentioned above (the positive voltage Vf+ and the negative voltage Vf−) are generated in a floating state (a state where the ground G1, the positive voltage Vdd, and the negative voltage Vss are electrically separated) with an internal reference potential (an internal ground) as a reference. The positive voltage Vf+ and the negative voltage Vf− generated in this way are supplied to the floating circuit unit 2 in a state where the internal ground mentioned above is electrically connected to the guard electrode 21. Note that the positive voltage Vf+ and the negative voltage Vf− are generated as DC voltages with substantially equal absolute values but with different polarities.

One end of the current-to-voltage converting resistor 33 is connected to the positive voltage Vdd and the other end of the current-to-voltage converting resistor 33 is connected to the collector terminal of the phototransistor of the photocoupler 26. By doing so, the resistor 33 and the phototransistor are connected in series between the positive voltage Vdd and the negative voltage Vss. This means that when the resistance value of the phototransistor has changed in accordance with the voltage value of the integrated signal V3, by dividing the potential difference (Vdd-Vss) between the positive voltage Vdd and the negative voltage Vss between the resistance value of the resistor 33 and the resistance of the phototransistor, the integrated signal V3a mentioned above is generated at the collector terminal of the phototransistor.

The voltage generating circuit 34 inputs and amplifies the integrated signal V3a to generate a voltage signal V4 (that is, a "reference voltage") and applies the voltage signal V4 to the guard electrode 21. Here, together with the guard electrode 21, the detection electrode 22, the current-to-voltage converting circuit 23, the integrating circuit 24, the driving circuit 25, and the photocoupler 26 of the floating circuit unit 2, the voltage generating circuit 34 forms a feedback loop and generates the voltage signal V4 by carrying out an amplification operation that amplifies the integrated signal V3a so as to cause the potential difference Vdi to fall. In the present embodiment, as one example, the voltage generating circuit 34 includes an AC amplifier circuit 34a, a phase compensating circuit 34b, and a booster circuit 34c. Here, the AC amplifier circuit 34a inputs and amplifies the integrated signal V3a to generate a voltage signal V4a. In this case, the AC amplifier circuit 34a carries out an amplification operation to generate the voltage signal V4a, an absolute value of the voltage of which changes in accordance with an increase or decrease in the absolute value of the voltage of the integrated signal V3a. To stabilize the feedback control operation (i.e., to prevent vibration), the phase compensating circuit 34b inputs the voltage signal V4a, adjusts the phase thereof, and outputs the result as a voltage signal V4b. As one example, the booster circuit 34c is constructed using a boosting transformer and boosts the voltage signal V4b by a predetermined gain (i.e. by increasing the absolute voltage without changing the polarity) to generate the voltage signal V4 and applies the voltage signal V4 to the guard electrode 21. The voltmeter 35 detects (measures) the effective value of the voltage signal V4 and outputs the effective value (as one example, the voltmeter 35 displays the effective value on its own display unit (not shown)).

Next, a detection operation (measurement operation) carried out on the AC voltage V1 of the detected object 4 by the voltage detecting apparatus 1 will now be described.

First, the floating circuit unit 2 (or the entire voltage detecting apparatus 1) is positioned near the detected object 4 so that the detection electrode 22 faces but does not contact the detected object 4. By doing so, as shown in FIG. 1, the capacitance C0 is formed between the detection electrode 22 and the detected object 4. Here, although the value of the capacitance C0 will change inversely proportionally to the distance between the detection electrode 22 and the detected object 4, once the floating circuit unit 2 has been initially disposed, such capacitance C0 will be a constant (i.e., non-varying) value so long as the environmental conditions, such as temperature, are constant. Since the value of the capacitance C0 is normally extremely small (for example, a range of several pF to around several tens of pF or so), even if the frequency of the AC voltage V1 is around several hundred Hz, the impedance between the detected object 4 and the detection electrode 22 will be sufficiently large (several MΩ). For this reason, in the voltage detecting apparatus 1, even when the AC voltage V1 of the detected object 4 and the voltage of the guard electrode 21 (i.e., the voltage value of the voltage signal V4) greatly differ (i.e., when the potential difference Vdi is large), it will still be possible to use a low-cost component with a low input withstand voltage in the first operational amplifier 23c that constructs the current-to-voltage converting circuit 23. Even when this construction is used, breakdown of the first operational amplifier 23c due to the potential difference Vdi is avoided.

If, when the voltage detecting apparatus 1 is started, the potential difference Vdi between the AC voltage V1 of the detected object 4 and the voltage of the guard electrode 21 (the reference voltage, here the voltage of the voltage signal V4) has increased (for example, when the potential difference Vdi has increased due to an increase in the AC voltage V1), the magnitude of the current signal I that flows from the detected object 4 via the detection electrode 22 into the current-to-voltage converting circuit 23 also increases. In this case, the current-to-voltage converting circuit 23 reduces the voltage value of the detection voltage signal V2 outputted by the current-to-voltage converting circuit 23. In the integrating circuit 24, due to the fall in the detection voltage signal V2, the current flowing from the output terminal of the second operational amplifier 24d via the capacitor 24c toward the inverted input terminal increases. For this reason, the integrating circuit 24 increases the voltage of the integrated signal V3. Also, in keeping with the increase in the voltage of the integrated signal V3, the transistor 25b of the driving circuit 25 makes a transition to a deeper ON state. By doing so, in the photocoupler 26, the current flowing in the light-emitting diode increases and the resistance of the phototransistor falls. Accordingly, the voltage of the integrated signal V3a generated by dividing the potential difference (Vdd-Vss) between the resistance of the resistor 33 and the resistance of the phototransistor also falls. Based on the integrated signal V3a, the voltage generating circuit 34 increases the voltage of the voltage signal V4 generated by the voltage generating circuit 34. In the voltage detecting apparatus 1, the current-to-voltage converting circuit 23, the integrating circuit 24, the driving circuit 25, the photocoupler 26, and the main circuit unit 3 that construct a feedback loop in this way detect the rise in the AC voltage V1 of the detected object 4 and carry out a feedback control operation that increases the voltage of the voltage signal V4 so that the voltage of the guard electrode 21 (i.e., the voltage of the voltage signal V4) follows the AC voltage V1.

Also, when the potential difference Vdi has increased due to a fall in the AC voltage V1, the magnitude of the current signal I flowing out from the current-to-voltage converting circuit 23 via the detection electrode 22 to the detected object 4 increases. At this time, the components such as the current-to-voltage converting circuit 23 that construct the feedback loop carry out the opposite operation to the feedback control operation described above to reduce the voltage of the voltage signal V4 and thereby cause the voltage of the guard electrode 21 (i.e., the voltage of the voltage signal V4) to follow the AC voltage V1. By doing so, in the voltage detecting apparatus 1, a feedback control operation that causes the voltage of the guard electrode 21 (i.e., the voltage of the voltage signal V4) to follow the AC voltage V1 is carried out in a short time, resulting in the voltage of the guard electrode 21 (which due to virtual shorting of the first operational amplifier 23c, is also the voltage of the detection electrode 22) being set equal to the AC voltage V1. The voltmeter 35 measures (detects) and displays the effective value of the voltage signal V4 (the "reference voltage", or voltage of the guard electrode 21) in real time. Accordingly, by observing the number displayed by the voltmeter 35, the operator can detect (measure) the AC voltage V1 of the detected object 4.

In this way, with the voltage detecting apparatus 1, in a state where the detection electrode 22 has been disposed facing the detected object 4, the current signal I that flows between the detected object 4 and the current-to-voltage converting circuit 23 (via the capacitance C0 formed between the detected object 4 and the detection electrode 22 and the detection electrode 22 itself) with a current value in keeping with the AC potential difference between the AC voltage V1 and the voltage signal V4 (reference voltage) is converted by the current-to-voltage converting circuit 23 to the detection voltage signal V2. By integrating the detection voltage signal V2 (more specifically, a current that flows based on the potential difference between the detection voltage signal V2 and the reference voltage) using the integrating circuit 24, the integrated signal V3 whose amplitude changes in accordance with the potential difference Vdi between the voltage of the detection electrode 22 (i.e., the voltage of the guard electrode 21) and the AC voltage V1 of the detected object 4 is generated. The integrated signal V3 is then converted using the photocoupler 26 to the integrated signal V3a that is electrically insulated from the integrated signal V3, the voltage signal V4 is generated based on the integrated signal V3a by the voltage generating circuit 34, and the voltage signal V4 is applied to the guard electrode 21.

According to the voltage detecting apparatus 1, since the magnitude of the capacitance C0 is normally extremely low (for example, in a range of several pF to several tens of pF), it is possible to set the impedance between the detected object 4 and the detection electrode 22 at a sufficiently high value (i.e., several MΩ). Since it is possible to set the input impedance of the current-to-voltage converting circuit 23 at a relatively low value, it becomes less likely that an overvoltage will be applied to the current-to-voltage converting circuit 23, so that even if low-cost components with a low input withstand voltage are used in the current-to-voltage converting circuit 23 of the current-to-voltage converting unit CV (more specifically, even if a low-cost component with a low withstand voltage is used for the first operational amplifier 23c that constructs the current-to-voltage converting circuit 23), it will still be possible to avoid breakdown of the first operational amplifier 23c due to the potential difference Vdi. That is, according to the voltage detecting apparatus 1, it is possible to solve the first problem described above and achieve the first object of the present invention.

Also, according to the voltage detecting apparatus 1, by using the photocoupler 26 as the insulating circuit, it becomes easy to electrically insulate (separate) the current-to-voltage converting circuit 23 and the following circuitry at an arbitrary position. Also, since the photocoupler 26 has favorable frequency characteristics over a wide range of frequencies, it is possible to precisely detect (measure) the AC voltage V1 of the detected object 4 over a wide range of frequencies. Note that it is also possible to construct an insulating circuit using a transformer (such as a pulse transformer) in place of an optical insulating element such as the photocoupler 26 and to construct an insulating circuit by connecting the photocoupler 26 and a transformer in parallel. With such constructions, the primary coil of the transformer functions as the primary-side circuit of the insulating circuit and the secondary coil functions as the secondary-side circuit. With the former construction, since a transformer will normally have favorable frequency characteristics at a higher frequency band than the photocoupler 26, by using a transformer when the frequency of the AC voltage V1 is limited to high frequencies, it is possible to detect (measure) the AC voltage V1 precisely. With the latter construction, by having the photocoupler 26 operate mainly at low frequencies and the transformer operate mainly at high frequencies, it is possible to provide the insulating circuit with favorable frequency characteristics over a wide frequency band. As a result, it is possible to detect (measure) the AC voltage V1 of the detected object 4 precisely over a significantly wider range of frequencies.

Also, according to the voltage detecting apparatus 1, by using a construction where at least the circuits from the circuit that comes after the detection electrode 22 to the primary-side circuit of the insulating circuit (i.e., the photocoupler 26), or in other words, the current-to-voltage converting circuit 23, the integrating circuit 24, the driving circuit 25, and the photocoupler 26 in the present embodiment, are enclosed within the guard electrode 21 so as to be covered by the guard electrode 21, it is possible to protect such circuits from the effects of external magnetic fields. As a result, it is possible to improve the detection precision (i.e., measurement precision) of the AC voltage V1.

According to the voltage detecting apparatus 1, by disposing the detection electrode 22 inside the guard electrode 21 at a position that faces the opening 21a formed in the guard electrode 21 but does not protrude from the opening 21a (a "non-protruding state" for the present invention), it is possible to protect the detection electrode 22 from the effects of external magnetic fields and thereby significantly improve the detection precision (i.e., measurement precision) of the AC voltage V1.

Also, according to the voltage detecting apparatus 1, by using a construction where the entire surface of the detection electrode 22 that faces the detected object 4 is covered with the insulating layer 21b as an insulator, it is possible to reliably prevent shorting between the detected object 4 and the detection electrode 22.

Note that although a construction is used in the voltage detecting apparatus 1 described above where the detection electrode 22 is disposed inside the guard electrode 21 at a position that faces the opening 21a formed in the guard electrode 21 so as to not protrude from the opening 21a (i.e., in a state where the detection electrode 22 is withdrawn from the surface of the guard electrode 21), if external magnetic fields have little effect, it is also possible to apply the present invention to a construction where the detection electrode 22 is attached inside the opening 21a so as to be substantially flush with the guard electrode 21 or so as to partially protrude from the guard electrode 21 and to a construction where the detection electrode 22 is attached onto the outer surface of the guard electrode 21 so as to cover the opening 21a. Note that with either construction, it should be obvious that the detection electrode 22 is electrically insulated from the guard electrode 21. Also, although a construction where the entire guard electrode 21 is covered by the insulating layer 21b has been described above, it is also possible to apply the present invention to a construction where only the detection electrode 22 that has a high probability of contact with the detected object 4 is covered by the insulating layer 21b and other parts are not covered.

Also, in a construction where the main power supply circuit 31 is supplied with an AC voltage from outside and generates the positive voltage Vdd and the negative voltage Vss, in place of a construction where the converter 32 is supplied with the positive voltage Vdd and the negative voltage Vss and generates the positive voltage Vf+ and the negative voltage Vf− (i.e., a construction where DC is generated from DC), it is possible to use a construction where the converter 32 receives an AC voltage from outside in the same way as the main power supply circuit 31 and generates the positive voltage Vf+ and the negative voltage Vf−. Note that in such construction where DC is generated from AC, by using a transformer in the same way as the example described above, the converter 32 is constructed as an insulated power supply where the primary side and the secondary side are electrically insulated from one another.

Also, although a construction where the photocoupler 26 and the driving circuit 25 thereof are disposed so as to come after the integrating circuit 24 and the integrated signal V3 is converted to the integrated signal V3a that is electrically insulated from the integrated signal V3 has been described above as an example, it is also possible to apply the present invention to a construction where the photocoupler 26 and the driving circuit 25 thereof are disposed so as to come before the integrating circuit 24, that is, between the current-to-voltage converting circuit 23 and the integrating circuit 24, and the detection voltage signal V2 is converted to a new detection voltage signal that is electrically insulated from the detection voltage signal V2 and outputted to the integrating circuit 24. It is also possible to apply the present invention to a construction where other circuits aside from the driving circuit 25, the photocoupler 26, and the integrating circuit 24 are added as appropriate between the main circuit unit 3 and the voltage generating circuit 34. When such construction is used, the insulating circuit (i.e., an optical insulating element and/or a transformer) is interposed on a path so as to receive a signal generated by any of the circuits present between the current-to-voltage converting circuit 23 and the voltage generating circuit 34 and output a signal that is electrically insulated from the inputted signal. Also, as described earlier, the part to be covered by the guard electrode 21 is the range from the circuit that comes after the detection electrode 22 (in the present embodiment, the current-to-voltage converting circuit 23) to the primary-side circuit of the photocoupler 26, that is, the primary-side circuit of the insulating circuit. This means that when the position of the insulating circuit has changed as described above, the circuits to be covered by the guard electrode 21 will also change in accordance with the disposed position of the insulating circuit. For example, in a construction where the photocoupler 26 that is the insulating circuit and the driving circuit 25 thereof are disposed so as to come before the integrating circuit 24, the current-to-voltage converting circuit 23, the driving circuit 25 and the primary-side of the photocoupler 26 will be covered by the guard electrode 21. As another example, it is also possible to apply the present invention to a construction equipped, together with a construction where the voltmeter 35 detects (measures) and outputs the effective value of the voltage signal V4, or in place of such construction, with a DSP (Digital Signal Processor) that samples the voltage signal V4 and displays the waveform of the voltage signal V4 on a display unit.

Figure 4:
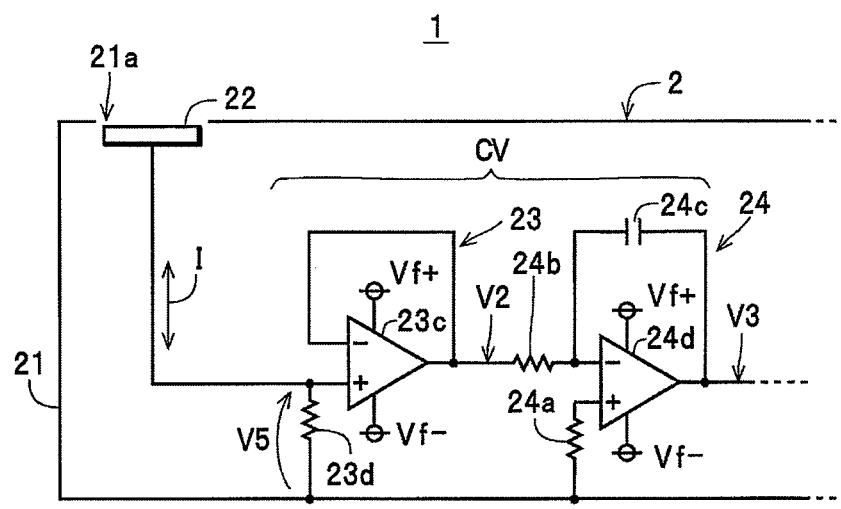
FIG. 4 is a circuit diagram showing the construction of another current-to-voltage converting unit.
Figure 5:
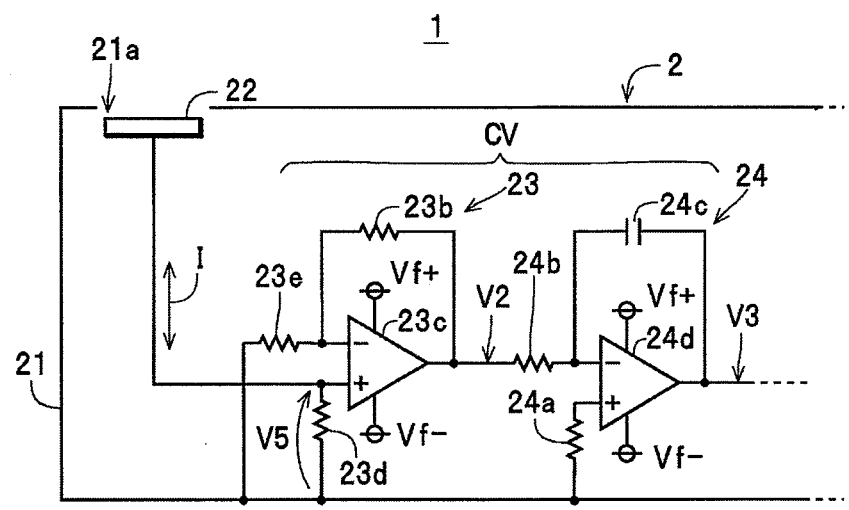
FIG. 5 is a circuit diagram showing the construction of another current-to-voltage converting unit.

Also, in place of the construction described above, the current-to-voltage converting unit CV may be realized using the construction shown in FIG. 4 or in FIG. 5. More specifically, in the current-to-voltage converting unit CV shown in FIG. 4, the current-to-voltage converting circuit 23 is composed of the first operational amplifier 23c constructed of a voltage follower and a resistor 23d disposed between the non-inverted input terminal of the first operational amplifier 23c and the guard electrode 21 (the reference voltage unit). By doing so, it is possible to convert the current signal I to a voltage V5 using the resistor 23d, with the first operational amplifier 23c (amplifier) that functions as a buffer (i.e., an amplifier with a gain of 1) outputting such voltage V5 (that is, the voltage generated across both ends of the resistor 23d) as the detection voltage signal V2. Also, in the current-to-voltage converting unit CV shown in FIG. 5, the current-to-voltage converting circuit 23 is constructed of the first operational amplifier 23c, the resistor 23d disposed between the non-inverted input terminal of the first operational amplifier 23c and the guard electrode 21 (reference voltage unit), a resistor 23e disposed between the inverted input terminal of the first operational amplifier 23c and the guard electrode 21, and the resistor 23b disposed as a feedback circuit between the output terminal and the inverted input terminal of the first operational amplifier 23c. By doing so, the current signal I can be converted to the voltage V5 by the resistor 23d and the voltage V5 (i.e., the voltage generated across both ends of the resistor 23d) is outputted as the detection voltage signal V2 by the first operational amplifier 23c (amplifier) that functions as a non-inverting amplifier. Accordingly, with voltage detecting apparatuses 1 that use the current-to-voltage converting units CV shown in FIGS. 4 and 5 also, it is possible to achieve the same operational effects as the voltage detecting apparatus 1 equipped with the current-to-voltage converting unit CV of the construction shown in FIG. 1.

Also, although an example where the current-to-voltage converting unit CV is constructed of the current-to-voltage converting circuit 23 and the integrating circuit 24 has been described above, as shown in FIG. 6, it is also possible to construct the current-to-voltage converting unit CV of a single integrating circuit 27. The integrating circuit 27 includes a function as a current-to-voltage converting circuit and a function as an integrating circuit, and as one example, has the construction of the current-to-voltage converting circuit 23 shown in FIG. 1 as a base construction, with a capacitor 27a also being connected in parallel to the resistor 23b. In this case, the capacitor 27a is constructed of a capacitor with a capacitance of around 0.01 μF, for example, and the resistor 23b is constructed of a resistor with a high resistance of around 1MΩ, for example. This means that in the integrating circuit 27, due to the current signal I mainly flowing in the capacitor 27a, an integrating operation is carried out at the same time as the current-to-voltage converting operation, and the integrated signal V3 whose voltage changes in proportion to the potential difference Vdi between the AC voltage V1 of the detected object 4 and the voltage (reference voltage) of the guard electrode 21 is generated. Accordingly, with a voltage detecting apparatus 1 that uses the current-to-voltage converting unit CV with the construction shown in FIG. 6 also, it is possible to achieve the same operational effects as the voltage detecting apparatus 1 that uses the current-to-voltage converting unit CV of the construction shown in FIG. 1. Note that in the integrating circuit 27 described above, the resistor 23b functions so as to suppress the drop in dynamic range since there is the risk that if only the capacitor 27a were used, the amount of feedback would become remarkably low in a state close to DC and the gain would become extremely high, resulting in saturation of the first operational amplifier 23c by the offset produced by the bias current. Also, although the non-inverted input terminal of the first operational amplifier 23c and the guard electrode 21 are connected via the resistor 23a, it is also possible to use a construction where the non-inverted input terminal and the guard electrode 21 are directly connected.

Although the voltage detecting apparatus 1 that uses a construction where the integrated signal V3 that is an analog signal generated by the floating circuit unit 2 is outputted to the main circuit unit 3 as the integrated signal V3a that is an analog signal that is electrically insulated from the integrated signal V3 has been described above, it is also possible to apply the present invention to a construction where the integrated signal V3 is converted to a digital signal and outputted to the main circuit unit 3. Other first voltage detecting apparatuses 1A, 1B that use such construction will now be described with reference to FIGS. 7 and 8. Note that components that are the same as in the voltage detecting apparatus 1 described above have been assigned the same reference numerals and description thereof is omitted.

First, the voltage detecting apparatus (another first voltage detecting apparatus) 1A will be described. As shown in FIG. 7, the voltage detecting apparatus 1A includes a floating circuit unit 2A and a main circuit unit 3A, and is constructed so as to be capable of detecting (measuring) the AC voltage V1 generated in the detected object 4 in a non-contact manner. As shown in FIG. 7, the floating circuit unit 2A includes the guard electrode 21, the detection electrode 22, the current-to-voltage converting unit CV, a buffer amplifier 28, an A/D converting circuit 29, and an insulating circuit 26A. The current-to-voltage converting unit CV may be any of the circuits shown in FIGS. 1, 4, 5, and 6, and as one example in the present embodiment, is constructed using the integrating circuit 27 shown in FIG. 6. The buffer amplifier 28 is constructed of an amplifier with a high input impedance and a low output impedance, receives an input of the integrated signal V3 outputted from the integrating circuit 27, and outputs the integrated signal V3 with a low impedance. The A/D converting circuit 29 is constructed of an A/D converter and samples the integrated signal V3 with a predetermined sampling period (a period that is sufficiently shorter than the period of the AC voltage V1) to convert the integrated signal V3 to digital data D1 that shows the voltage waveform of the integrated signal V3 and outputs the digital data D1. The insulating circuit 26A is constructed using a digital isolator (and is hereinafter referred to as the "digital isolator 26A"). The digital isolator 26A is a device that transmits the digital signal between an input and an output side in an electrically insulated manner. Examples of digital isolators include devices constructed using optically insulated isolators such as phototransistors and photocouplers and devices constructed using magnetically coupled isolators. In the present embodiment, the digital isolator 26A converts the digital data D1 outputted from the A/D converting circuit 29 to digital data D1a that is electrically insulated from the digital data D1 and outputs the digital data D1a via the wire W1 to the main circuit unit 3A.

As shown in FIG. 7, as one example, the main circuit unit 3A includes the main power supply circuit 31, the DC/DC converter 32, a voltage generating circuit 34A, and the voltmeter 35. The voltage generating circuit 34A includes a processing unit 34d, a D/A converting circuit 34e, and the booster circuit 34c. The processing unit 34d is constructed of a CPU or DSP (Digital Signal Processor), and carries out digital processing on the inputted digital data D1a, such as the amplification process and the phase adjusting process that are carried out by the AC amplifier circuit 34a and the phase compensating circuit 34b of the voltage detecting apparatus 1 described earlier, and outputs the processed digital data D1a as new digital data D2. The D/A converting circuit 34e receives input of the digital data D2 and converts the digital data D2 to an analog signal to generate and output the same signal as the voltage signal V4b generated by the phase compensating circuit 34b in the voltage detecting apparatus 1. The booster circuit 34c boosts the voltage signal V4b by a predetermined gain to generate the voltage signal V4 and applies the voltage signal V4 to the guard electrode 21.

According to the voltage detecting apparatus 1A also, in the same way as the voltage detecting apparatus 1, it is possible to detect (measure) the AC voltage V1 of the detected object 4 via the capacitance C0 that is normally extremely small. This means that even if a low-cost component with a low input withstand voltage is used for the first operational amplifier 23c that constructs the current-to-voltage converting circuit 23 of the current-to-voltage converting unit CV, it will still be possible to avoid breakdown of the first operational amplifier 23c due to the potential difference Vdi. Also, in the voltage detecting apparatus 1A, since the digital isolator 26A is used as an insulating circuit to convert the integrated signal V3 outputted from the integrating circuit 27 to the digital data D1 and the digital data D1 is outputted to the main circuit unit 3A as the digital data D1a so as to be electrically insulated from the digital data D1, compared to a construction that outputs the integrated signal V3 as an analog signal, it is possible to transmit information on the integrated signal V3 (i.e., the voltage waveform) with high precision to the main circuit unit 3A without being affected by the temperature, changes over time, and the like for the transfer path (the wire W1). As a result, it is possible to improve the detection precision (measurement precision) of the AC voltage V1.

Note that although not shown, it is also possible to use a construction that generates the voltage signal V4 using a voltage generating circuit constructed of the D/A converting circuit 34e and the component elements of the voltage generating circuit 34 of the voltage detecting apparatus 1 (i.e., the AC amplifier circuit 34a, the phase compensating circuit 34b, and the booster circuit 34c), where the D/A converting circuit 34e receives a direct input of the digital data D1a and converts the digital data D1a to an analog signal, and the AC amplifier circuit 34a, the phase compensating circuit 34b, and the booster circuit 34c operate in the same way as in the voltage detecting apparatus 1 on such analog signal.

Next, a voltage detecting apparatus (another first voltage detecting apparatus) 1B will be described. Note that components that are the same as in the voltage detecting apparatuses 1, 1A described above have been assigned the same reference numerals and description thereof is omitted.

Figure 8:
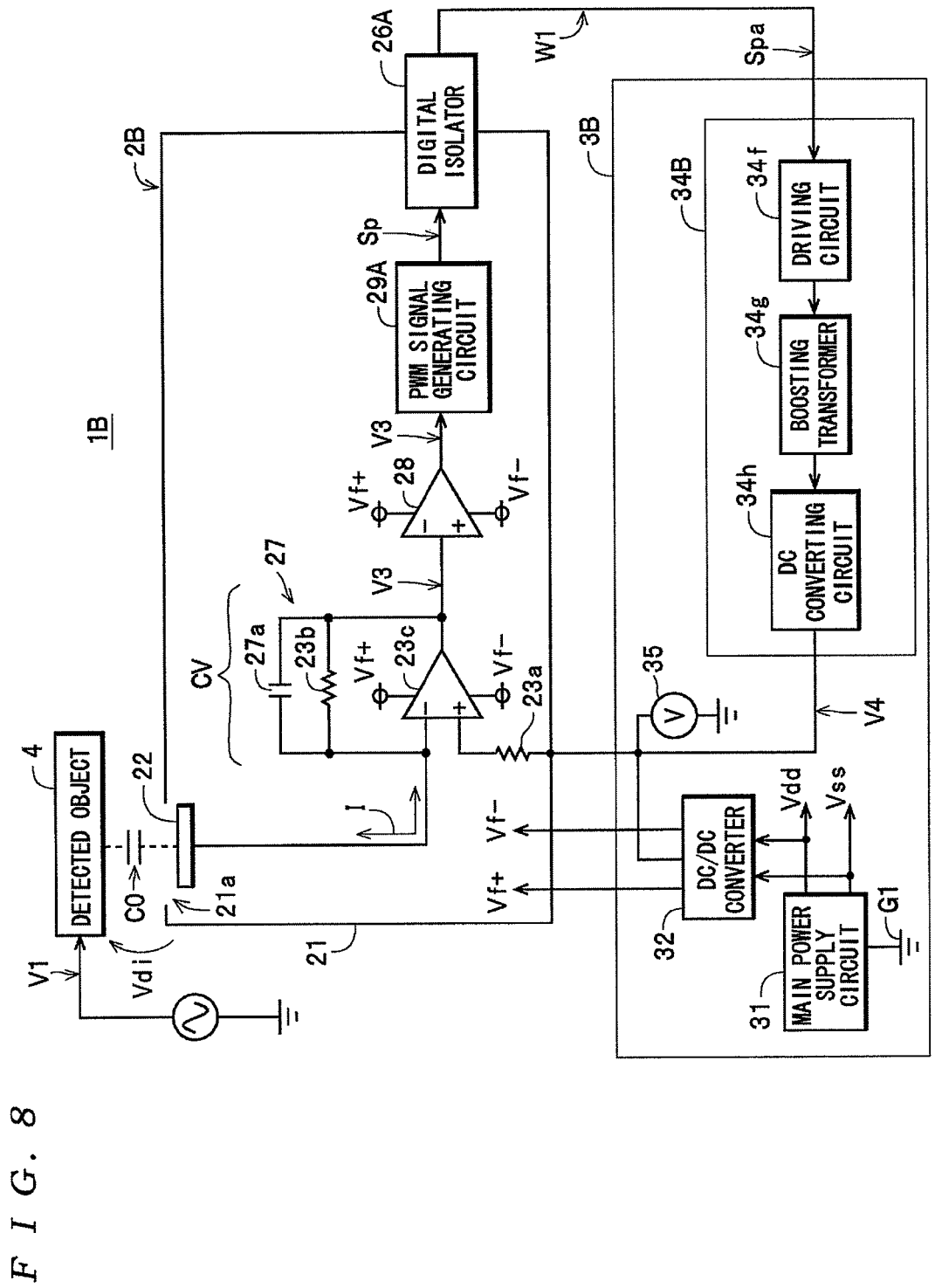
FIG. 8 is a block diagram showing the construction of another first voltage detecting apparatus.

As shown in FIG. 8, the voltage detecting apparatus 1B includes a floating circuit unit 2B and a main circuit unit 3B, and is constructed so as to be capable of detecting (measuring) the AC voltage V1 generated in the detected object 4 in a non-contact manner. As shown in FIG. 8, the floating circuit unit 2B includes the guard electrode 21, the detection electrode 22, the current-to-voltage converting unit CV, the buffer amplifier 28, a PWM signal generating circuit 29A, and the insulating circuit 26A (the digital isolator 26A). In the same way as the voltage detecting apparatus 1A, the current-to-voltage converting unit CV is constructed for example using the integrating circuit 27 shown in FIG. 6. The buffer amplifier 28 receives an input of the integrated signal V3 and outputs the integrated signal V3 with low impedance. The PWM signal generating circuit 29A subjects the inputted integrated signal V3 to pulse width modulation to generate and output a pulse signal (a binary signal (digital signal), or in other words, a signal where a "High" level and a "Low" level are set at predetermined voltage values) Sp whose pulse width changes in accordance with the voltage value of the integrated signal V3. As one example in the present embodiment, the PWM signal generating circuit 29A includes a triangular wave generating circuit that generates a triangular wave with a fixed period and a comparator that compares the triangular wave and the inputted integrated signal V3 and generates the pulse signal Sp (neither the triangular wave generating circuit nor the comparator is shown). As one example, in the present embodiment, the PWM signal generating circuit 29A generates the pulse signal Sp with the same period as the triangular wave so that the pulse width decreases when the voltage value of the integrated signal V3 has increased and the pulse width increases when the voltage value of the integrated signal V3 has decreased. The digital isolator 26A converts the pulse signal Sp to a pulse signal Spa that is electrically insulated from the pulse signal Sp and outputs the pulse signal Spa to the main circuit unit 3B via the wire W1.

As shown in FIG. 8, as one example the main circuit unit 3B includes the main power supply circuit 31, the DC/DC converter 32, a voltage generating circuit 34B, and the voltmeter 35. As one example in the present embodiment, as shown in FIG. 8, the voltage generating circuit 34B is constructed as a boosting circuit and includes a driving circuit 34f that includes a switching element that is controlled by the pulse signal Spa so as to switch on and off, a boosting transformer 34g that has a primary coil and a secondary coil and whose primary coil is driven by the driving circuit 34f, and a DC converting circuit 34h that generates the voltage signal V4 by rectifying and smoothing the AC voltage induced in the secondary coil of the boosting transformer 34g. By using this construction, the voltage generating circuit 34B is controlled so as to shorten the On period of the switching element when the pulse width of the pulse signal Spa has decreased to lower the voltage signal V4, and so as to extend the On period of the switching element when the pulse width of the pulse signal Spa has increased to raise the voltage signal V4. The voltage generating circuit 34B applies the voltage signal V4 to the guard electrode 21.

This means that according to the voltage detecting apparatus 1B also, in the same way as the voltage detecting apparatuses 1, 1A, it is possible to detect (measure) the AC voltage V1 of the detected object 4 via the capacitance C0 that is normally extremely small. As a result, it is possible to avoid breakdown of the first operational amplifier 23c due to the potential difference Vdi, even if a low-cost component with a low withstand voltage is used for the first operational amplifier 23c that constructs the integrating circuit 27 of the current-to-voltage converting unit CV. Also, in the voltage detecting apparatus 1B, in the same way as in the voltage detecting apparatus 1A, by using the digital isolator 26A as the insulating circuit, the integrated signal V3 outputted from the integrating circuit 27 is converted to the pulse signal Sp that is a binary signal and the pulse signal Sp is outputted to the main circuit unit 3B as the pulse signal Spa that is electrically insulated from the pulse signal Sp. This means that compared to a construction where the integrated signal V3 is outputted as an analog signal, it is possible to transmit information (voltage waveform) on the integrated signal V3 to the main circuit unit 3B with high precision without being affected by the temperature, changes over time, and the like of the transfer route (the wire W1), and as a result it is possible to improve the detection precision (measurement precision) of the AC voltage V1.

Next, a line voltage detecting apparatus (first line voltage detecting apparatus) 51 equipped with a plurality of the voltage detecting apparatuses 1, the voltage detecting apparatuses 1A, or the voltage detecting apparatuses 1B described above will be described. Note that the line voltage detecting unit 51 may be constructed of only the voltage detecting apparatuses 1, only the voltage detecting apparatuses 1A, or only the voltage detecting apparatuses 1B, of two types of apparatus selected from the voltage detecting apparatus 1, the voltage detecting apparatus 1A, and the voltage detecting apparatus 1B, or a mixture of all such types of apparatus. In the following description however, an example where the line voltage detecting apparatus 51 is constructed of only the voltage detecting apparatuses 1 will be described.

First, the line voltage detecting apparatus 51 will be described with reference to the drawings. Note that an example where line voltages of three-phase (R phase, S phase, and T phase), three-wire AC paths (hereinafter simply "paths") R, S, T are detected (measured) will be described.

Figure 9:
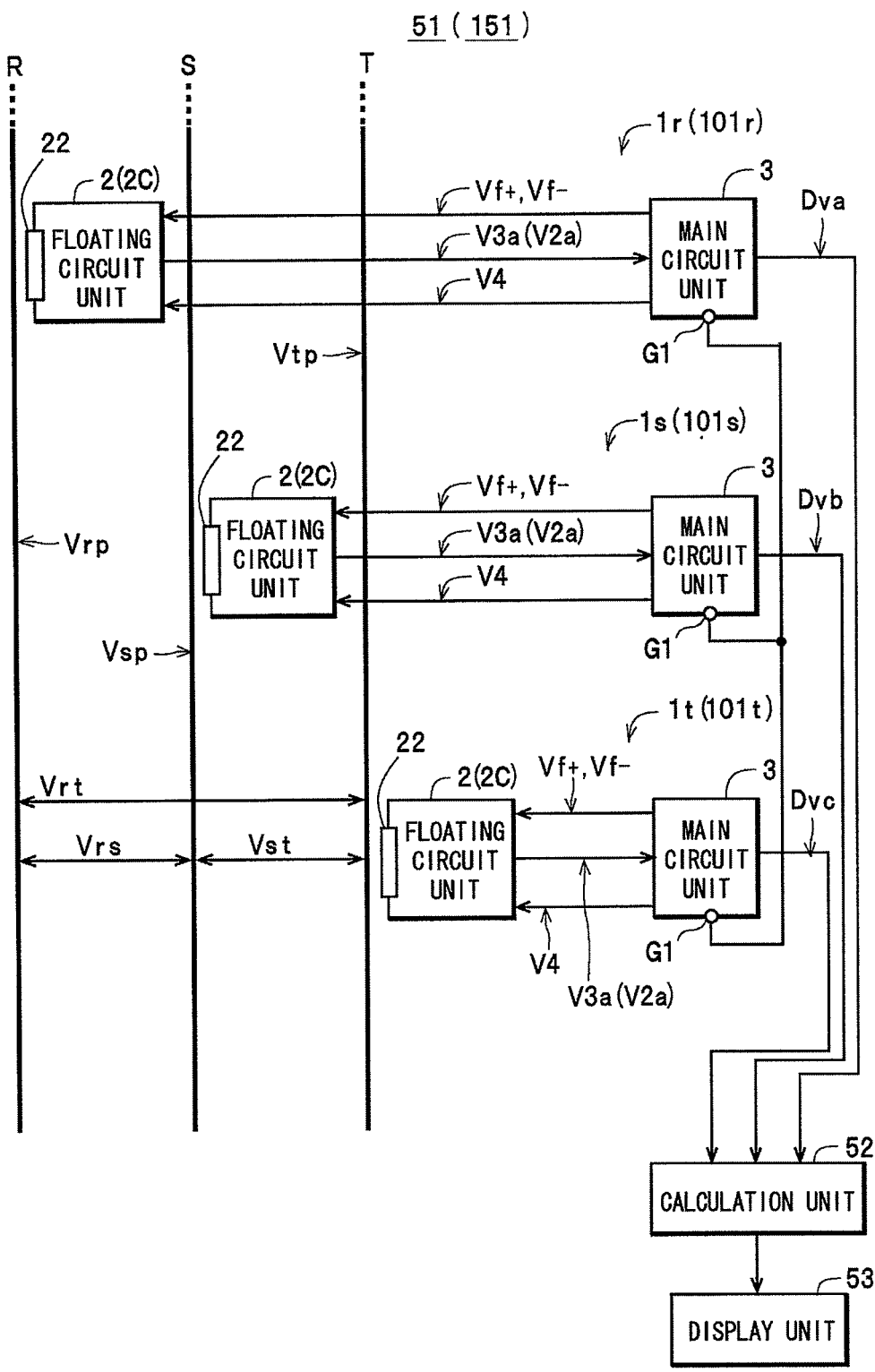
FIG. 9 is a block diagram showing the construction of first and second line voltage detecting apparatuses that use the voltage detecting apparatuses shown in FIGS. 1 and 10.

As one example, as shown in FIG. 9, the line voltage detecting unit 51 includes an equal number of (here, three) voltage detecting apparatuses 1 to the number of paths R, S, T (hereinafter, the voltage detecting apparatuses 1 are referred to individually as the voltage detecting apparatuses 1r, 1s, 1t corresponding to the paths R, S, T and as the "voltage detecting apparatuses 1" when no special distinction is required), a calculation unit 52, and a display unit 53, and is constructed so as to be capable of detecting (measuring) a line voltage Vrs between the paths R, S, a line voltage Vst between the paths S, T, and a line voltage Vrt between the paths R, T in a non-contact manner.

As shown in FIG. 9, the respective voltage detecting apparatuses 1 have the same construction and are each equipped with the floating circuit unit 2 and the main circuit unit 3 described above, have the paths R, S, T as the respective detected objects thereof, and carry out feedback control to match the respective voltage signals V4 to the AC voltages Vrp, Vsp, Vtp (detected AC voltages) on such paths. In the voltage detecting apparatuses 1r, 1s, 1t in the present embodiment, the respective voltmeters 35 output voltage data Dva, Dvb, Dvc showing the waveforms of the voltage signals V4 that have been detected (measured). Hereinafter, when no special distinction is required, the voltage data Dva, Dvb, Dvc are collectively referred to as the "voltage data Dv".

The calculation unit 52 is constructed of a calculation circuit that includes a CPU and a memory (neither of which is shown), and carries out a line voltage calculating process that finds (calculates) the line voltages based on the voltage data Dv outputted from the respective voltage detecting apparatuses 1. The calculation unit 52 displays the result of the line voltage calculating process on the display unit 53. In the present embodiment, the display unit 53 is constructed of a monitor apparatus such as a liquid crystal display. Note that it is also possible to construct the display unit 53 of a print apparatus such as a printer. Also, the ground G1 of each main circuit unit 3 is connected to one another, as described later. The calculation unit 52 and the display unit 53 operate by being supplied with the positive voltage Vdd and the negative voltage Vss from the main power supply circuit 31 included in the main circuit unit 3 of one out of the three main circuit units 3. By using this construction, the floating circuit units 2, the main circuit units 3, the calculation unit 52, and the display unit 53 are placed in an electrically floating state from the Earth.

Next, a detection operation (measurement operation) by the line voltage detecting apparatus 51 will be described.

First, during detection (measurement), as shown in FIG. 9, to detect (measure) the AC voltage Vrp of the path R using the voltage detecting apparatus 1r, the floating circuit unit 2 of the voltage detecting apparatus 1r is positioned near the path R and the detection electrode 22 of the voltage detecting apparatus 1r is positioned opposite the corresponding path R. In the same way, to detect (measure) the AC voltages Vsp, Vtp of the paths S, T, the detection electrodes 22 of the respective floating circuit units 2 of the other voltage detecting apparatuses 1s, 1t are positioned opposite the corresponding paths S, T. By doing so, the capacitance C0 (see FIG. 1) is formed between each of the respective detection electrodes 22 and the paths R, S, T. Here, although the respective values of the capacitance C0 will change inversely proportionately to the distances between the respective detection electrodes 22 and the cores of the paths R, S, T, after the floating circuit units 2 have been disposed, such capacitances C0 will be constant (i.e., not vary) so long as environmental conditions such as humidity are constant. Also, since the respective capacitances C0 are normally extremely low (for example, in a range of several pF to several tens of pF), the impedances between the paths R, S, T and the respective detection electrodes 22 will be sufficiently large (several MΩ). By doing so, in the line voltage detecting apparatus 51 also, even if the potential differences Vdi between the paths R, S, T and the corresponding detection electrodes 22 are large, breakdown of the first operational amplifier 23c in any of the voltage detecting apparatuses 1 due to the AC voltages Vrp, Vsp, Vtp of the paths R, S, T is prevented. Also, by connecting (shorting) the ground G1 of each voltage detecting apparatuses 1, the potential of the ground G1 in each voltage detecting apparatus 1 is set equal.

Next, when the line voltage detecting apparatus 51 is started, in the voltage detecting apparatus 1r, the current-to-voltage converting circuit 23, the integrating circuit 24, the driving circuit 25, the photocoupler 26, and the main circuit unit 3 that construct the feedback loop carry out a feedback control operation that changes the voltage of the voltage signal V4 in keeping with the changes in the AC voltage Vrp of the path R. By doing so, the voltage of the guard electrode 21 (which is also the voltage of the voltage signal V4 and the voltage of the detection electrode 22) will follow the AC voltage Vrp. In the voltage detecting apparatuses 1s, 1t also, the current-to-voltage converting circuit 23, the integrating circuit 24, the driving circuit 25, the photocoupler 26, and the main circuit unit 3 that construct the feedback loop carry out a feedback control operation that changes the voltage of the voltage signal V4 in keeping with the changes in the AC voltages Vsp, Vtp of the paths S, T. By doing so, the voltages of the respective guard electrodes 21 (which are also the voltages of the respective voltage signals V4 and the voltages of the respective detection electrodes 22) will follow the AC voltages Vsp, Vtp. Also, the voltmeters 35 of the respective voltage detecting apparatuses 1 continuously output the voltage data Dva, Dvb, Dvc that respectively show the waveforms of the voltages of the voltage signals V4 that have been detected (measured), that is, the AC voltages Vrp, Vsp, Vtp of the paths R, S, T.

The calculation unit 52 inputs the voltage data Dva, Dvb, Dvc outputted from the respective voltage detecting apparatuses 1 and stores the data in the memory. Next, the calculation unit 52 carries out a line voltage calculating process. More specifically, the calculation unit 52 calculates the voltage difference between the voltage data Dva, Dvb to find (calculate) the line voltage Vrs between the paths R, S. In the same way, the calculation unit 52 calculates the voltage difference between the voltage data Dvb, Dvc to find (calculate) the line voltage Vst between the paths S, T and calculates the voltage difference between the voltage data Dva, Dvc to find (detect) the line voltage Vrt between the paths R, T. In this case, as described earlier, since the AC voltages Vrp, Vsp, Vtp of the paths R, S, T are detected (measured) by the respective voltage detecting apparatuses 1 with the shared ground G1 as a reference, by calculating the voltage differences between the AC voltages Vrp, Vsp, Vtp, the line voltages Vrs, Vst, Vrt can be accurately found (calculated) regardless of the potential of the reference potential. The calculation unit 52 also has the calculated line voltages Vrs, Vst, Vrt displayed on the display unit 53.

In this case according to the line voltage detecting apparatus 51, by using the voltage detecting apparatuses 1, even if a low-cost component with a low input withstand voltage is used for the first operational amplifier 23c that constructs the current-to-voltage converting circuit 23 in each voltage detecting apparatus 1, it will still be possible to avoid breakdown of the first operational amplifier 23c due to the potential difference Vdi. As a result, it is possible to detect (measure) the line voltages Vrs, Vst, Vrt while reducing the apparatus cost.

Note that the present invention is not limited to the above construction. For example, although an example has been described where a plurality of the voltage detecting apparatuses 1 of the same construction that are respectively equipped with the main power supply circuit 31 and the converter 32 are used, it is also possible to apply the present invention to a construction where the main power supply circuit 31 and the converter 32 are provided in one out of the plurality of voltage detecting apparatuses 1 and the positive voltage Vdd, the negative voltage Vss, the positive voltage Vf+, and the negative voltage Vf− are supplied from such voltage detecting apparatus 1 to the other voltage detecting apparatuses 1.

Second Embodiment

A second embodiment of a voltage detecting apparatus and a line voltage detecting apparatus will now be described with reference to the attached drawings.

First, a voltage detecting apparatus (second voltage detecting apparatus) 101 according to the present embodiment will be described with reference to the drawings. Note that components that are the same as in the voltage detecting apparatus 1 described above have been assigned the same reference numerals and description thereof is omitted.

Figure 10:
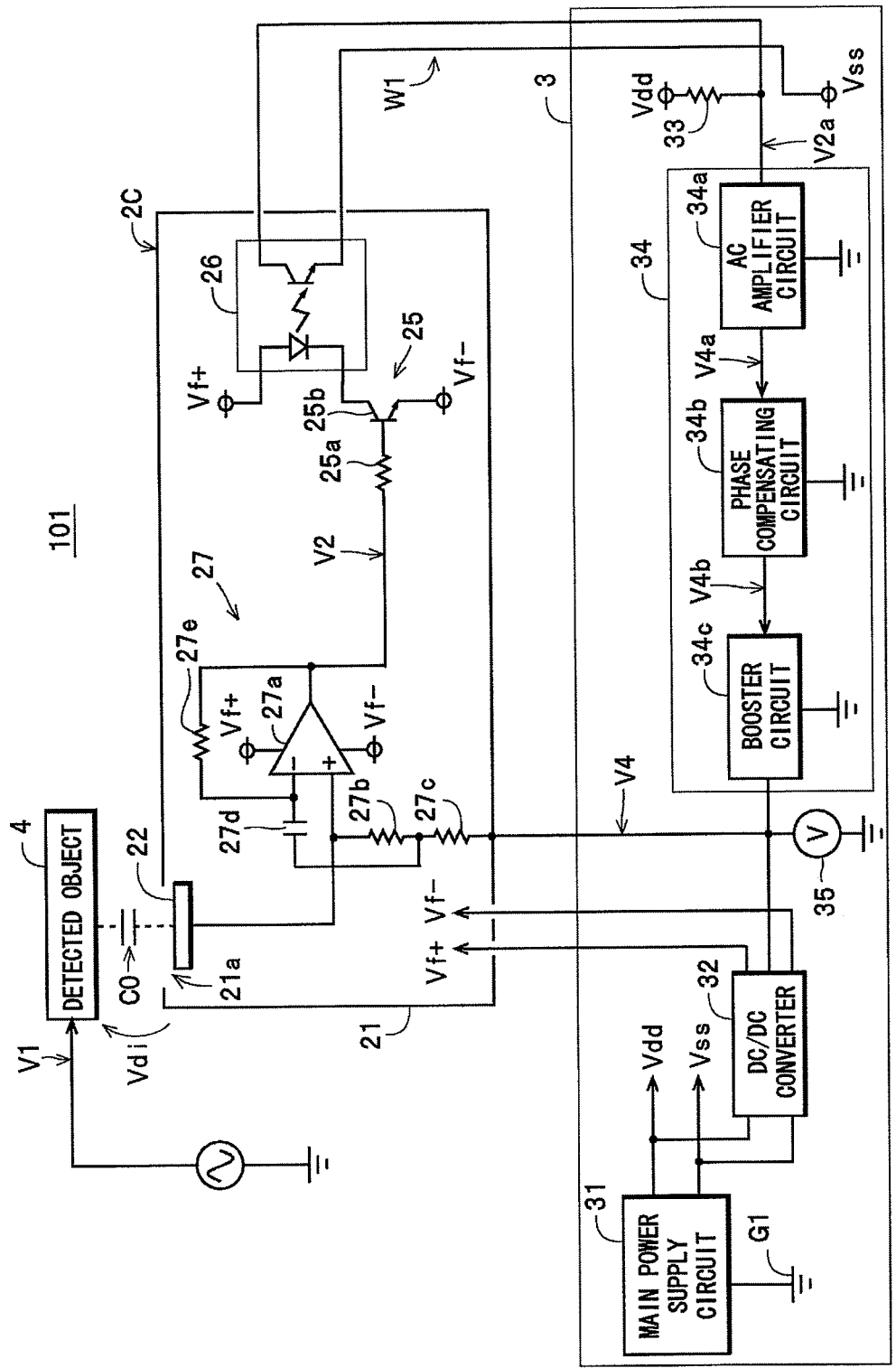
FIG. 10 is a block diagram showing the construction of a second voltage detecting apparatus.

The voltage detecting apparatus 101 is a non-contact voltage detecting apparatus, includes a floating circuit unit 2C and a main circuit unit 3 as shown in FIG. 10, and is constructed so as to be capable of detecting (measuring) an AC voltage V1 (detected AC voltage) generated in a detected object (measured object) 4 in a non-contact manner.

As shown in FIGS. 10, 11, a floating circuit unit 2C includes the guard electrode 21, the detection electrode 22, a bootstrap circuit 27, the driving circuit 25, and the insulating circuit 26. As one example in the present embodiment, the insulating circuit 26 is constructed of a photocoupler (and is hereinafter also referred to as the "photocoupler 26"). The guard electrode 21 is constructed using a conductive material (for example, a metal material) as a reference voltage unit in the floating circuit unit 2C, and as one example, the bootstrap circuit 27, the driving circuit 25, and the photocoupler 26 are enclosed inside the guard electrode 21. By doing so, the circuitry from the bootstrap circuit 27 to the photocoupler 26 is covered by the guard electrode 21. Note that the part to be covered by the guard electrode 21 may be the circuitry from the bootstrap circuit 27 to the primary-side circuit of the photocoupler 26 (the light-emitting diode described later). This means that it is also possible to use a construction where the secondary-side circuit of the photocoupler 26 (the phototransistor described later) is not covered by the guard electrode 21. Note that since the specific construction of the guard electrode 21 is the same as in the voltage detecting apparatus 1, description thereof is omitted.

As one example, as shown in FIG. 10, the bootstrap circuit 27 includes an operational amplifier 27a, two resistors 27b, 27c that are disposed so as to be connected in series between the non-inverted input terminal of the operational amplifier 27a and the guard electrode 21, a capacitor 27d that is disposed between the inverted input terminal of the operational amplifier 27a and the connection point between the resistors 27b, 27c, and a resistor 27e disposed between the inverted input terminal and the output terminal of the operational amplifier 27a. The detection electrode 22 is connected to the non-inverted input terminal of the operational amplifier 27a. In the bootstrap circuit 27, the operational amplifier 27a operates by being supplied with the positive voltage Vf+ and the negative voltage Vf− described later, inputs the voltage generated in the detection electrode 22 and outputs a detection voltage signal (detection signal) V2 with a voltage in accordance with the potential difference Vdi between the AC voltage V1 of the detected object 4 and the voltage (reference voltage) of the guard electrode 21. In this case, the amplitude of the detection voltage signal V2 changes in proportion to the amplitude of the potential difference Vdi.

The driving circuit 25 is disposed together with the photocoupler 26 so as to come after the bootstrap circuit 27. As one example, the driving circuit 25 is constructed of a transistor (as one example in the present embodiment, an NPN bipolar transistor) 25b with a base terminal connected to the output terminal of the operational amplifier 27a via the input resistor 25a, a collector terminal connected to the photocoupler 26, and an emitter terminal connected to the negative voltage Vf−. By using this construction, by driving the photocoupler 26 using the driving circuit 25 so as to operate in a linear region, the resistance value of the phototransistor in the photocoupler 26 will change in accordance with (substantially proportionally) to the voltage of the detection voltage signal V2. Accordingly, together with the resistor 33 of the main circuit unit 3 described later, the photocoupler 26 converts the detection voltage signal V2 inputted from the bootstrap circuit 27 to a new detection voltage signal (an insulated detection signal) V2a that is electrically insulated from the detection voltage signal V2.

As shown in FIG. 10, as one example, the main circuit unit 3 includes the main power supply circuit 31, the converter 32, the resistor 33 for converting a current to a voltage, the voltage generating circuit 34, and the voltmeter 35, and has the same construction as the main circuit unit 3 of the voltage detecting apparatus 1.

One end of the current-to-voltage converting resistor 33 is connected to the positive voltage Vdd and the other end of the current-to-voltage converting resistor 33 is connected to the collector terminal of the phototransistor of the photocoupler 26. By doing so, the resistor 33 and the phototransistor are connected in series between the positive voltage Vdd and the negative voltage Vss. This means that when the resistance value of the phototransistor has changed in accordance with the voltage value of the detection signal V2, by dividing the potential difference (Vdd−Vss) between the positive voltage Vdd and the negative voltage Vss between the resistance value of the resistor 33 and the resistance of the phototransistor, the detection signal V2a mentioned above is generated at the collector terminal of the phototransistor.

By inputting and amplifying the detection voltage signal V2a, the voltage generating circuit 34 generates the voltage signal V4 (that is, the reference voltage) and applies the voltage signal V4 to the guard electrode 21. In this case, together with the guard electrode 21, the detection electrode 22, the bootstrap circuit 27, the driving circuit 25, and the photocoupler 26 of the floating circuit unit 2C, the voltage generating circuit 34 forms a feedback loop, and by carrying out an amplification operation that amplifies the detection voltage signal V2a so as to reduce the potential difference Vdi, the voltage generating circuit 34 generates the voltage signal V4. In the present embodiment, as one example, the voltage generating circuit 34 includes the AC amplifier circuit 34a, the phase compensating circuit 34b, and the booster circuit 34c. Here, the AC amplifier circuit 34a inputs and amplifies the detection voltage signal V2a to generate the voltage signal V4a. In this case, the AC amplifier circuit 34a carries out an amplification operation on the voltage signal V4a whose absolute voltage value changes in accordance with increases and decreases in the absolute voltage of the detection voltage signal V2a to generate the voltage signal V4a.

Next, a detection operation (measurement operation) carried out on the AC voltage V1 of the detected object 4 by the voltage detecting apparatus 101 will now be described.

First, the floating circuit unit 2C (or the entire voltage detecting apparatus 101) is positioned near the detected object 4 so that the detection electrode 22 faces but does not contact the detected object 4. By doing so, as shown in FIG. 10, the capacitance C0 is formed between the detection electrode 22 and the detected object 4. Here, although the value of the capacitance C0 will change inversely proportionally to the distance between the detection electrode 22 and the detected object 4, once the floating circuit unit 2C has been initially disposed, such capacitance C0 will be a constant (i.e., non-varying) value so long as the environmental conditions, such as temperature, are constant. The value of the capacitance C0 is normally in a range of several pF to several tens of pF or so.

Next, when the voltage detecting apparatus 101 is started, if the potential difference Vdi between the AC voltage V1 of the detected object 4 and the voltage of the guard electrode 21 (the reference voltage or voltage of the voltage signal V4) has increased (for example when the potential difference Vdi has increased due to an increase in the AC voltage V1), the bootstrap circuit 27 increases the voltage value of the detection voltage signal V2 outputted by the bootstrap circuit 27 in accordance with the increase in the potential difference Vdi. Also, in keeping with the voltage increase in the detection voltage signal V2, the transistor 25b of the driving circuit 25 makes a transition to a deeper ON state. By doing so, in the photocoupler 26, the current flowing in the light-emitting diode increases and the resistance of the phototransistor falls. Accordingly, the voltage of the detection voltage signal V2a generated by dividing the potential difference (Vdd−Vss) between the resistance of the resistor 33 and the resistance of the phototransistor falls. The voltage generating circuit 34 increases the voltage of the voltage signal V4 generated by the voltage generating circuit 34 based on the detection voltage signal V2a. In the voltage detecting apparatus 101, the bootstrap circuit 27, the driving circuit 25, the photocoupler 26, and the main circuit unit 3 that construct a feedback loop in this way detect the increase in the AC voltage V1 of the detected object 4, and by carrying out a feedback control operation that increases the voltage value of the voltage signal V4, cause the voltage of the guard electrode 21 (i.e., the voltage of the voltage signal V4) to follow the AC voltage V1.

When the potential difference Vdi has increased due to a drop in the AC voltage V1, the bootstrap circuit 27 and the like that construct the feedback loop carry out the opposite operation to the feedback control operation described above to lower the voltage of the voltage signal V4 and thereby cause the voltage of the guard electrode 21 (i.e., the voltage of the voltage signal V4) to follow the AC voltage V1. By doing so, in the voltage detecting apparatus 101, a feedback control operation that causes the voltage of the guard electrode 21 (i.e., the voltage of the voltage signal V4) to follow the AC voltage V1 is carried out in a short time, resulting in the voltage of the guard electrode 21 (which due to virtual shorting of the operational amplifier 27a, is also the voltage of the detection electrode 22) being set equal to the AC voltage V1. The voltmeter 35 measures (detects) and displays the effective value of the voltage signal V4 (the reference voltage, or voltage of the guard electrode 21) in real time. Accordingly, by observing the number displayed by the voltmeter 35, the operator can detect (measure) the AC voltage V1 of the detected object 4.

In this way, in the voltage detecting apparatus 101, in a state where the detection electrode 22 has been disposed facing the detected object 4, the bootstrap circuit 27 generates, based on the potential difference Vdi between the AC voltage V1 and the voltage signal (reference voltage) V4, the detection voltage signal (detection signal) V2 whose amplitude changes in accordance with the potential difference Vdi, the photocoupler 26 converts the detection voltage signal V2 to the detection voltage signal (insulated detection signal) V2a that is electrically insulated from the detection voltage signal V2, and the voltage generating circuit 34 generates the voltage signal V4 based on the detection voltage signal V2a and applies the voltage signal V4 to the guard electrode 21. In the voltage detecting apparatus 101, since the circuit connected to the detection electrode 22 is the bootstrap circuit 27 that has extremely high input impedance, the impedance of the detection electrode 22 is maintained at a high impedance, and the entire floating circuit unit 2C that is the load of the voltage generating circuit 34 will have a high impedance (a state where the load of the voltage generating circuit 34 is light).

This means that according to the voltage detecting apparatus 101, the voltage generating circuit 34 is capable of causing the voltage of the voltage signal V4 outputted by the voltage generating circuit 34 to favorably follow an AC voltage V1 with a short period (i.e., a high frequency), and as a result, it is possible to precisely detect (measure) the AC voltage V1 across a wide frequency range (a broad frequency band). That is, the voltage detecting apparatus 101 solves the second problem described above and therefore achieves the second object described above.

According to the voltage detecting apparatus 101, by using the photocoupler 26 as the insulating circuit, it is possible to easily electrically insulate (i.e., separate) the floating circuit unit 2C and the main circuit unit 3. Since the photocoupler 26 also has favorable frequency characteristics across a wide frequency range, it is possible to precisely detect (measure) the AC voltage V1 of the detected object 4 across a wide range of frequencies. Note that it is also possible to construct the insulating circuit using a transformer (such as a pulse transformer) in place of an optical insulating element such as the photocoupler 26 and to construct the insulating circuit by connecting the photocoupler 26 and a transformer in parallel. With such constructions, the primary coil of the transformer functions as the primary-side circuit of the insulating circuit and the secondary coil functions as the secondary-side circuit. With the former construction, since a transformer will normally have favorable frequency characteristics at a higher frequency band than the photocoupler 26, by using the transformer, it is possible to increase the maximum frequency of the frequency band where detection of the AC voltage V1 is possible. With the latter construction, by having the photocoupler 26 operate mainly at low frequencies and the transformer operate mainly at high frequencies, it is possible to provide the insulating circuit with favorable frequency characteristics over a wide frequency band. As a result, it is possible to detect (measure) the AC voltage V1 of the detected object 4 precisely over a wider range of frequencies.

Also, according to the voltage detecting apparatus 101, by using a construction where the bootstrap circuit 27, the driving circuit 25, and the photocoupler 26 are enclosed within the guard electrode 21 so as to be covered by the guard electrode 21, it is possible to protect such circuits from the effects of external magnetic fields. As a result, it is possible to improve the detection precision of the AC voltage V1.

According to the voltage detecting apparatus 101, by disposing the detection electrode 22 inside the guard electrode 21 at a position that faces the opening 21a formed in the guard electrode 21 but does not protrude from the opening 21a (a "non-protruding state" for the present invention), it is possible to protect the detection electrode 22 from the effects of external magnetic fields and thereby significantly improve the detection precision of the AC voltage V1.

Also, according to the voltage detecting apparatus 101, by using a construction where the entire surface of the detection electrode 22 that faces the detected object 4 is covered with the insulating layer 21b as an insulator, it is possible to reliably prevent shorting between the detected object 4 and the detection electrode 22.

It is also possible to apply the present invention to a construction equipped, together with a construction where the voltmeter 35 detects (measures) the effective value of the voltage signal V4, or in place of such construction, with a DSP (Digital Signal Processor) that samples for example the voltage signal V4 and generates the waveform data of the voltage signal V4. By using this construction, it is possible to output the waveform data outside the voltage detecting apparatus 101 and/or to display a waveform of the AC voltage V1 on a display unit provided in the voltage detecting apparatus 101 based on the waveform data.

Also, although the floating circuit unit 2C of the bootstrap circuit 27 shown in FIG. 10 described above uses a construction where the resistor 27e is disposed between the inverted input terminal and the output terminal of the operational amplifier 27a to provide the operational amplifier 27a with a gain, this can also be realized by using the construction shown in FIG. 12 in place of such construction. In the bootstrap circuit 27 of the other floating circuit unit 2C shown in FIG. 12, by shorting the inverted input terminal of the operational amplifier 27a and the output terminal of the operational amplifier 27a without providing the resistor 27e, the operational amplifier 27a is caused to function as a buffer (i.e., an amplifier with a gain of 1).

Also, in the same way as the line voltage detecting apparatus 51 (see FIG. 9) described above that is constructed using a plurality of voltage detecting apparatuses such as the voltage detecting apparatus 1, it is possible to construct a line voltage detecting apparatus (a second line voltage detecting apparatus) 151 such as that shown in FIG. 9 using a plurality of the voltage detecting apparatuses 101. Note that since the line voltage detecting apparatus 151 is constructed using a plurality of voltage detecting apparatuses 101 in place of the voltage detecting apparatuses 1 of the line voltage detecting apparatus 51, detailed description of the construction is omitted.

Next, a detection operation (measurement operation) by the line voltage detecting apparatus 151 will be described.

First, during detection (measurement), as shown in FIG. 9, to detect (measure) the AC voltage Vrp of the path R using the voltage detecting apparatus 101r, the floating circuit unit 2 of the voltage detecting apparatus 1r is positioned near the path R and the detection electrode 22 of the voltage detecting apparatus 1r is positioned opposite the corresponding path R. In the same way, to detect (measure) the AC voltages Vsp, Vtp of the paths S, T, the detection electrodes 22 of the respective floating circuit units 2 of the other voltage detecting apparatuses 101s, 101t are positioned opposite the corresponding paths S, T. By doing so, the capacitance C0 (see FIG. 1) is formed between each of the respective detection electrodes 22 and the paths R, S, T. Here, although the respective values of the capacitance C0 will change inversely proportionally to the distances between the respective detection electrodes 22 and the cores of the paths R, S, T, after the floating circuit units 2 have been disposed, such capacitances C0 will be constant (i.e., not vary) so long as environmental conditions such as humidity are constant. Also, by connecting (shorting) the ground G1 of each voltage detecting apparatuses 101, the potential of the ground G1 in each voltage detecting apparatus 101 is set equal.

When the line voltage detecting apparatus 151 is started, in the voltage detecting apparatus 101r, the bootstrap circuit 27, the driving circuit 25, the photocoupler 26, and the main circuit unit 3 that construct the feedback loop carry out a feedback control operation that changes the voltage value of the voltage signal V4 in accordance with changes in the AC voltage Vrp of the path R to cause the voltage of the guard electrode 21 (i.e., the voltage of the voltage signal V4 and also the voltage of the detection electrode 22) to follow the AC voltage Vrp. Similarly, in each of the other voltage detecting apparatuses 101s, 101t, the bootstrap circuit 27, the integrating circuit 24, the driving circuit 25, the photocoupler 26, and the main circuit unit 3 that construct the feedback loops carry out a feedback control operation that changes the voltages of the respective voltage signals V4 in accordance with changes in the AC voltages Vsp, Vtp of the paths S, T to cause the respective voltages of the guard electrodes 21 (i.e., the voltages of the voltage signals V4 and also the voltages of the detection electrodes 22) to follow the AC voltages Vsp, Vtp. The voltmeters 35 of the voltage detecting apparatuses 101 continuously output voltage data Dva, Dvb, Dvc respectively showing the waveforms of detected (measured) voltage signals V4, that is, the AC voltages Vrp, Vsp, Vtp of the paths R, S, T.

The calculation unit 52 inputs the voltage data Dva, Dvb, Dvc outputted from the respective voltage detecting apparatuses 101 and stores the data in the memory. Next, the calculation unit 52 carries out a line voltage calculating process. More specifically, the calculation unit 52 calculates the voltage difference between the voltage data Dva, Dvb to find (calculate) the line voltage Vrs between the paths R, S. In the same way, the calculation unit 52 calculates the voltage difference between the voltage data Dvb, Dvc to find (calculate) the line voltage Vst between the paths S, T and calculates the voltage difference between the voltage data Dva, Dvc to find (detect) the line voltage Vrt between the paths R, T. In this case, as described earlier, since the AC voltages Vrp, Vsp, Vtp of the paths R, S, T are detected (measured) by the respective voltage detecting apparatuses 101 with the shared ground G1 as a reference, by calculating the voltage differences between the AC voltages Vrp, Vsp, Vtp, the line voltages Vrs, Vst, Vrt can be accurately found (calculated) regardless of the potential of the reference potential. The calculation unit 52 also has the calculated line voltages Vrs, Vst, Vrt displayed on the display unit 53.

In this way, according to the line voltage detecting apparatus 151, by using the voltage detecting apparatuses 101 that each include the bootstrap circuit 27, it is possible to accurately detect the AC voltages Vrp, Vsp, Vtp across a wide frequency band. This means it is possible to also detect (measure) the line voltages Vrs, Vst, Vrt across a wide frequency band.

Note that although an example has been described where a plurality of the voltage detecting apparatuses 101 of the same construction that are respectively equipped with the main power supply circuit 31 and the converter 32 are used, it is also possible to apply the present invention to a construction where the main power supply circuit 31 and the converter 32 are provided in one out of the plurality of voltage detecting apparatuses 101, and the positive voltage Vdd, the negative voltage Vss, the positive voltage Vf+, and the negative voltage Vf− are supplied from such voltage detecting apparatus 101 to the other voltage detecting apparatuses 101.

Third Embodiment

A third embodiment of a voltage detecting apparatus and a line voltage detecting apparatus will now be described with reference to the attached drawings.

First, a voltage detecting apparatus (third voltage detecting apparatus) 201 according to the present embodiment will be described with reference to the drawings. Note that components that are the same as in the voltage detecting apparatuses 1, 101 described above have been assigned the same reference numerals and description thereof is omitted.

Figure 13:
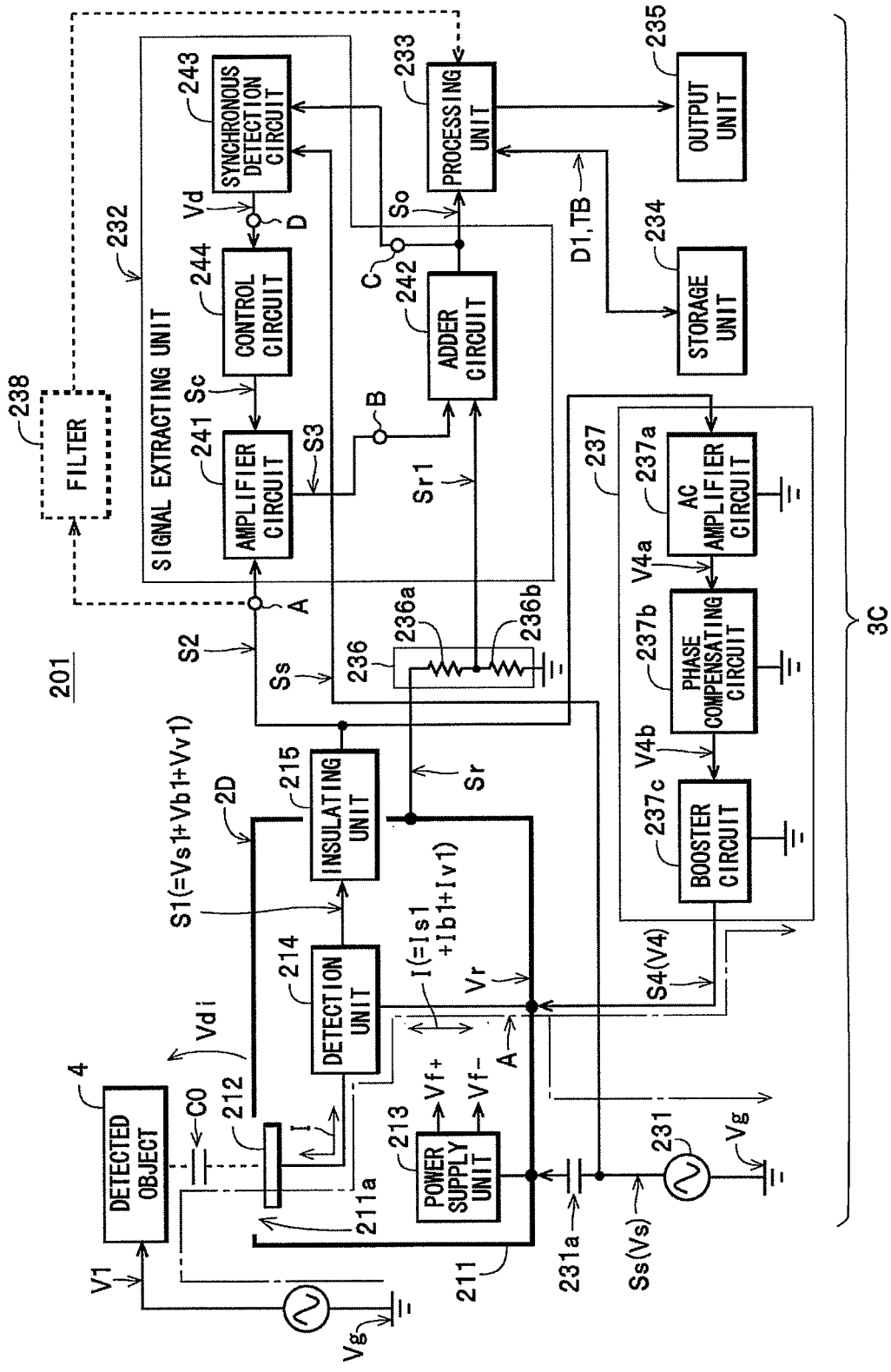
FIG. 13 is a block diagram showing the construction of a third voltage detecting apparatus.

The voltage detecting apparatus 201 is a non-contact voltage detecting apparatus and as shown in FIG. 13 includes a floating circuit unit 2D and a main circuit unit 3C. The voltage detecting apparatus 201 is constructed so as to be capable of detecting the AC voltage V1 (detected AC voltage) generated in the detected object 4 using ground potential Vg as a reference.

As shown in FIG. 13, the floating circuit unit 2D includes a guard electrode 211, a detection electrode 212, a power supply unit 213, a detection unit 214, and an insulating unit 215. The guard electrode 211 is constructed using a conductive material (as one example, a metal material) as a reference voltage unit in the floating circuit unit 2D, and encloses the detection electrode 212, the detection unit 214, and the insulating unit 215. Note that as described later, since the insulating unit 215 is equipped with a function that outputs a signal inputted into the primary-side circuit thereof from the secondary-side circuit thereof so as to be electrically insulated from the primary-side circuit, the part of the floating circuit unit 2D that needs to be covered by the guard electrode 211 may extend as far as the primary-side circuit, though it is also possible to use a construction where the secondary-side circuit is also covered by the guard electrode 211. In the present embodiment, as one example, an opening (hole) 211a is formed in the guard electrode 211. The detection electrode 212 is formed in a plate-like shape, for example, and is disposed at a position facing the opening 211a inside the guard electrode 211 so as not to contact the guard electrode 211. When detecting the AC voltage V1, the detection electrode 212 is capacitively coupled to the detected object 4 as shown in FIG. 13 (to produce the capacitance C0).

The power supply unit 213 is constructed as a floating power supply that generates a variety of floating voltages that have the voltage Vr of the guard electrode 211 as a reference (zero volts). The power supply unit 213 supplies the generated floating voltages as operation voltages to the component elements disposed inside the guard electrode 211. In the present embodiment, as one example, the power supply unit 213 includes a battery and a DC/DC converter (neither of which is shown), and the DC/DC converter generates the variety of floating voltages (for example, Vf+ that is a plus voltage and Vf− that is a minus voltage) as the operation voltages based on a DC voltage outputted from the battery. Note that although not shown, in place of the battery, it is also possible to use a construction where the AC voltage is supplied, via a transformer from outside the guard electrode 211 to the inside of the guard electrode 211 so as to be electrically insulated therefrom, and the AC voltage is converted by a rectifying/smoothing unit provided inside the guard electrode 211 to a DC voltage and supplied to the DC/DC converter.

The detection unit 214 operates by being supplied with the floating voltages Vf+, Vf− set with the voltage Vr of the guard electrode 211 as a reference and generates a detection signal S1 whose amplitude changes in accordance with the AC potential difference (V1−Vr) based on the current signal I (detection current) that flows with a current value that corresponds to the AC potential difference (V1−Vr) between the AC voltage V1 and the voltage Vr of the guard electrode 211. Here, a standard signal Ss is outputted (applied) from a standard signal outputting unit 231, described later, via a capacitor C31a to the guard electrode 211 and a voltage signal S4 is also outputted (applied) from a feedback control unit 237, described later. With this construction, the voltage Vr is a composite voltage composed of the voltage (feedback voltage) V4 of the voltage signal S4 and the voltage Vs of the standard signal Ss. By doing so, the current signal I described above is composed of a current signal component (reference current component) Is1 due to the standard signal Ss, a current signal component (FB current component) Ib1 due to the voltage signal S4, and a current signal component (measured current component) Iv1 due to the AC voltage V1 of the detected object 4. The detection signal S1 based on the current signal I is also composed of a voltage signal component (standard voltage component) Vs1 based on the standard current component Is1, a voltage signal component (FB voltage component) Vb1 based on an FB current component Ib1, and a voltage signal component (measured voltage component) Vv1 based on the measured current component Iv1. Also, since the detection unit 214 generates the detection signal S1 by operating with the voltage of the guard electrode 211 that varies due to the voltage Vs of the standard signal Ss and the voltage V4 of the voltage signal S4 as a reference, the standard voltage component Vs1 included in the detection signal S1 is a signal with opposite phase to the standard signal Ss and the FB voltage component Vb1 included in the detection signal S1 is a signal with opposite phase to the voltage signal S4.

Figure 14:
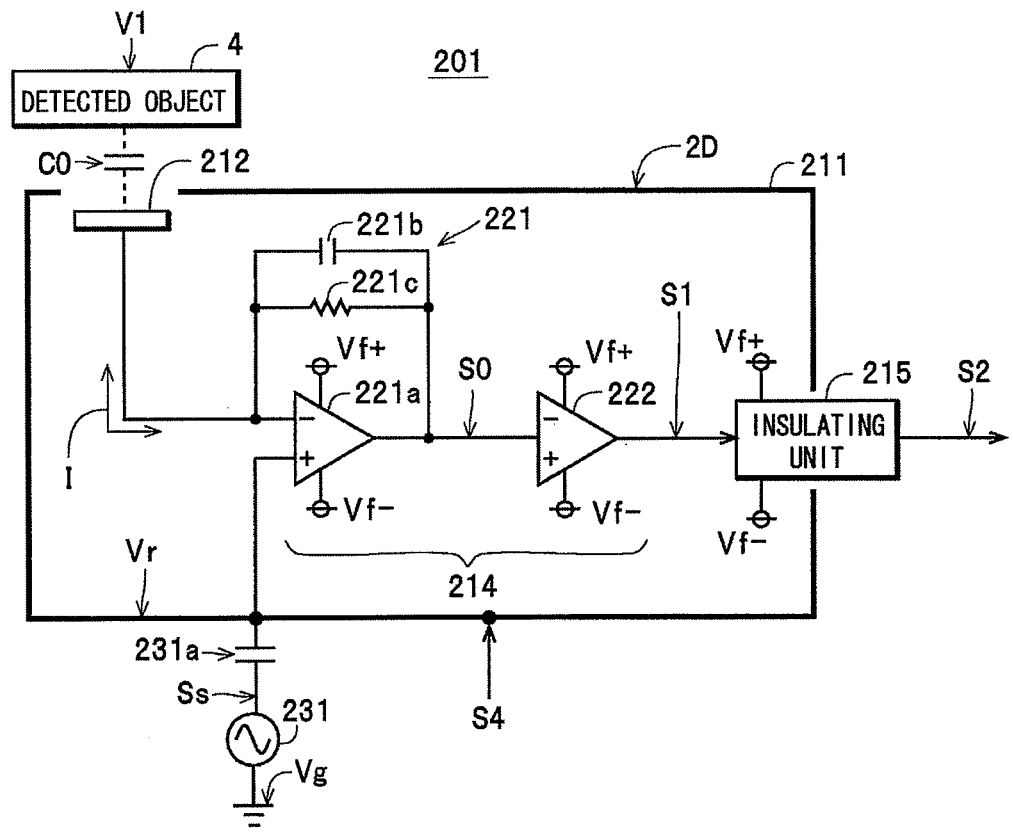
FIG. 14 is a circuit diagram of a floating circuit unit appearing in FIG. 13.

In the present embodiment, as one example, as shown in FIG. 14, the detection unit 214 includes an integrating circuit 221 and an amplifier circuit 222. The integrating circuit 221 includes an operational amplifier 221a with a non-inverted input terminal connected to the guard electrode 211 and an inverted input terminal connected to the detection electrode 212, a capacitor 221b connected between the inverted input terminal and the output terminal of the operational amplifier 221a, and a resistor 221c that is connected in parallel with the capacitor 221b. In this case, the capacitor 221b is composed of a capacitor with a capacitance of around 0.01 µF for example, and the resistor 221c is constructed of a resistor with a high resistance of around 1MΩ, for example. For this reason, in the integrating circuit 221, due to the current signal I mainly flowing in the capacitor 221b, a current-to-voltage converting operation and an integrating operation are simultaneously carried out to generate a voltage signal S0 whose voltage changes in proportion to the AC potential difference (V1−Vr) between the AC voltage V1 of the detected object 4 and the voltage Vr of the guard electrode 211. Note that in the integrating circuit 221, since there is the risk that if only the capacitor 221b were used, the amount of feedback would become remarkably low in a state close to DC and the gain would become extremely high, resulting in saturation of the operational amplifier 211a by the offset produced by the bias current, the resistor 221c is disposed so as to suppress the drop in dynamic range due to such saturation. The amplifier circuit 222 amplifies the voltage of the voltage signal S0 by a predetermined gain and outputs the result as the detection signal S1. Note that although not shown, as one example the integrating circuit 221 may be constructed of two circuits, that is, a current-to-voltage converting circuit that converts the current signal I to a voltage signal and an integrating circuit that integrates the voltage signal and outputs the result as the detection signal S1.

The insulating unit 215 inputs the detection signal S1 and outputs the detection signal S1 as an insulated detection signal S2 that is electrically insulated from the detection signal S1. More specifically, as one example, the insulating unit 215 is constructed using an optical insulating element (as one example in the present embodiment, a photocoupler) and outputs the detection signal S1 inputted into a light-emitting diode (not shown) used as the primary-side circuit of the insulating unit 215 as the insulated detection signal S2 from a phototransistor as the secondary-side circuit of the insulating unit 215. That is, the insulating unit 215 outputs a signal that has the same phase as the detection signal S1 and whose amplitude changes in proportion to the amplitude of the detection signal S1 as the insulated detection signal S2. Note that in place of a photocoupler, it is also possible to construct the insulating unit 215 using an optical MOS-FET constructed with a light-emitting diode as the primary-side circuit and a FET pair as the secondary-side circuit. In this case, the primary-side circuit of the insulating unit 215 operates by being supplied with the floating voltages Vf+, Vf−. When the detection signal S1 is high-frequency AC, it is also possible to construct the insulating unit 215 using a transformer.

The floating circuit unit 2D constructed as described above has flat frequency characteristics in a wide frequency band that extends from a low frequency (several Hz) to a high frequency (several hundred Hz). As described above, the floating circuit unit 2D detects the current signal I (detection current) that flows with a magnitude in keeping with the potential difference (V1−Vr) and generates and outputs the insulated detection signal S2 whose amplitude changes in accordance with the AC potential difference (V1−Vr).

As shown in FIG. 13, the main circuit unit 3C includes the standard signal outputting unit 231, a signal extracting unit 232, a processing unit 233, a storage unit 234, an output unit 235, an amplitude converting unit 236, and a feedback control unit 237. Here, the standard signal outputting unit 231 generates the standard signal Ss (an Ac signal whose frequency and amplitude are constant) with a constant amplitude and a voltage Vs that changes with a predetermined period with the ground potential Vg as a reference and outputs the standard signal Ss via the capacitor 231a to the guard electrode 211. As one example, in the present embodiment, as described later, the frequency fs of the standard signal Ss is set within a frequency band W3 that exceeds the frequency bands W1, W2 where the feedback control unit 237 is capable of response (see FIG. 16). The amplitude converting unit 236 inputs the voltage (the voltage Vr) generated in the guard electrode 211 as a voltage signal Sr, changes the amplitude thereof (by k times, where k is a positive real number) and outputs the result as a voltage signal (reference signal) Sr1. Here, as described earlier, since the voltage Vr includes the voltage V4 of the voltage signal S4 and the voltage Vs of the standard signal Ss, the reference signal Sr1 is a composite voltage composed of the voltages V4, Vs that have been amplified by k times. As one example, in the present embodiment, the amplitude converting unit 236 is constructed of an attenuator (as one example, two resistors 236a, 236b that are connected in series), changes the amplitude (in the present embodiment, reduces the amplitude) of the voltage signal Sr by dividing the voltage, and outputs the result as the reference signal Sr1. Note that it is also possible to construct the amplitude converting unit 236 of an amplifier that amplifies a signal by a predetermined gain to make the amplitude of the reference signal Sr1 larger than the amplitude of the voltage signal Sr.

As one example, the signal extracting unit 232 includes an amplifier circuit 241, an adder circuit 242, a synchronous detection circuit 243, and a control circuit 244, and amplifies the insulated detection signal S2 by a predetermined gain to generate an amplified detection signal S3. Also, by controlling the gain when amplifying the insulated detection signal S2 so that the signal component of the standard signal Ss included in the amplified detection signal S3 (hereinafter also referred to as the "first signal component") and the signal component of the standard signal Ss included in the reference signal Sr1 (hereinafter also referred to as the "second signal component") will cancel each other out when the amplified detection signal S3 and the reference signal Sr1 are subjected to addition or subtraction (addition as one example in the present embodiment), the signal extracting unit 232 generates and outputs an output signal So composed of a signal component of the AC voltage V1 as described later. Here, the first signal component of the standard signal Ss included in the amplified detection signal S3 refers to a signal component due to the standard voltage component Vs1 included in the detection signal S1 (that is, a signal component with the same frequency as the standard signal Ss included in the amplified detection signal S3) that is caused by the outputting (application) of the standard signal Ss to the guard electrode 211. The second signal component of the standard signal Ss included in the reference signal Sr1 refers to a signal component with the same frequency as the standard signal Ss included in the reference signal Sr1 that is caused by the outputting (application) of the standard signal Ss to the guard electrode 211.

Figure 15:
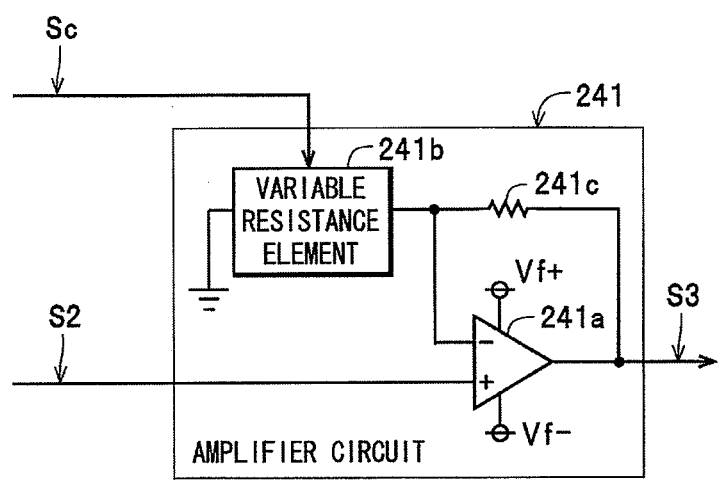
FIG. 15 is a circuit diagram of an amplifier circuit appearing in FIG. 13

More specifically, the amplifier circuit 241 inputs the insulated detection signal S2 and generates and outputs the amplified detection signal S3 by amplifying the insulated detection signal S2 by a gain (a gain that may be one or greater, or under one) set by the level (DC voltage level) of a control signal (more specifically, control voltage) Sc outputted from the control circuit 244. As one example, as shown in FIG. 15, the amplifier circuit 241 includes an operational amplifier 241a, a variable resistance element (as one example in the present embodiment, a J-FET (Junction Field Effect Transistor)) 241b disposed between an inverted input terminal and a ground terminal of the operational amplifier 241a, and a resistor 241c that is disposed between the inverted input terminal and the output terminal of the operational amplifier 241a, and is constructed as a whole as a non-inverting amplifier circuit. Here, the variable resistance element 241b changes its resistance in accordance with the level of the inputted control signal Sc. This means that the amplifier circuit 241 changes its gain in accordance with the level of the inputted control signal Sc, amplifies the insulated detection signal S2 by such gain, and outputs the result as the amplified detection signal S3. Note that as the variable resistance element, it is also possible to use an element or circuit aside from the J-FET so long as such element or circuit changes its resistance in accordance with a voltage inputted from outside. In the present embodiment, as one example, the variable resistance element 241b is constructed so that the resistance thereof falls when the level of the inputted control signal Sc has increased and the resistance thereof rises when the level of the inputted control signal Sc has decreased. With this construction, the gain of the amplifier circuit 241 will increase when the level of the control signal Sc has increased and will decrease when the level of the control signal Sc has decreased.

The adder circuit 242 inputs the amplified detection signal S3 and the reference signal Sr1 and adds the signals S3, Sr1 and outputs the added signal obtained by the addition as the output signal So. Here, as described above, the detection signal S1 is composed of the standard voltage component Vs1 with opposite phase to the standard signal Ss, the FB voltage component Vb1 with opposite phase to the voltage signal S4, and the measured voltage component Vv1 with the same phase as the AC voltage V1. This means that the insulated detection signal S2 generated based on the detection signal S1 and the amplified detection signal S3 generated by amplifying the insulated detection signal S2 are composed of a signal component with opposite phase to the standard signal Ss, a signal component with opposite phase to the voltage signal S4, and a signal component with the same phase as the AC voltage V1. In this case, the amplified detection signal S3 is controlled so that the amplitude of the first signal component (hereinafter also referred to as the "opposite-phase signal component") that has the opposite phase to the standard signal Ss included in the amplified detection signal S3 is finally set at the same amplitude as the amplitude of the second signal component of the standard signal Ss included in the reference signal Sr1 outputted from the amplitude converting unit 236 (i.e., an amplitude produced by multiplying the amplitude of the standard signal Ss by k: k×Ss).

On the other hand, since the voltage Vs of the voltage signal Sr is a composite voltage composed of the voltage V4 of the voltage signal S4 and the voltage Vs of the standard signal Ss as described above, the reference signal Sr1 that is generated by multiplying the amplitude of the voltage signal Sr by k is composed of a signal component with the same phase as the standard signal Ss (a signal produced by multiplying the amplitude of the standard signal Ss by k) and a signal component with the same phase as the voltage signal S4 (a signal produced by multiplying the amplitude of the voltage signal S4 by k).

Accordingly, by subjecting both signals S3, Sr1 to an addition process using the adder circuit 242, the opposite-phase signal component ("first signal component") of the standard signal Ss that constructs the amplified detection signal S3 and a second signal component (hereinafter referred to as the "same-phase signal component") with the same phase as the standard signal Ss that constructs the reference signal Sr1 cancel each other out. This means that the output signal So includes (i) two signal components that construct the amplified detection signal S3 and are a signal component with the opposite phase to the voltage signal S4 and a signal component with the same phase as the AC voltage V1 and (ii) a signal component (i.e., a signal produced by multiplying the amplitude of the voltage signal S4 by k) that constructs the reference signal Sr1 and has the same phase as the voltage signal S4.

The synchronous detection circuit 243 inputs the output signal So and the standard signal Ss and by carrying out synchronous detection on the output signal So using the standard signal Ss, generates and outputs a wave detection signal Vd. More specifically, by carrying out synchronous detection, the synchronous detection circuit 243 generates and outputs the wave detection signal Vd where the absolute value of the voltage increases or decreases in accordance with increases and decreases in the amplitude of the signal component of the standard signal Ss included in the output signal So (more specifically, a signal component with the same frequency as the standard signal Ss) and where the polarity differs according to whether the phase of the signal component of the standard signal Ss included in the output signal So matches the phase of the signal component of the standard signal Ss included in the output signal So (i.e., when the phases match) or whether such phases are 180° apart (i.e., when the phases are opposite). In the present embodiment, as one example, the synchronous detection circuit 243 generates and outputs the wave detection signal Vd that has positive polarity (i.e., is a positive voltage) when the predetermined signal component included in the output signal So and the standard signal Ss have the same phase and negative polarity (i.e., is a negative voltage) when the phases are opposite.

The control circuit 244 generates the control signal Sc whose voltage increases and decreases based on the polarity of the inputted wave detection signal Vd and outputs the control signal Sc to the amplifier circuit 241. In the present embodiment, as one example, the control circuit 244 raises the voltage level of the control signal Sc when the inputted wave detection signal Vd has positive polarity and conversely lowers the voltage level of the control signal Sc when the inputted wave detection signal Vd has negative polarity. With the above construction, in the signal extracting unit 232, feedback control is carried out by the synchronous detection circuit 243 and the control circuit 244 over the gain (amplification ratio) of the amplifier circuit 241, and the control circuit 244 carries out control based on the wave detection signal Vd of the amplification ratio of the amplifier circuit 241 so that the amplitude of the opposite-phase signal component that constructs the amplified detection signal S3 (i.e., the first signal component with the same frequency as but opposite phase to the standard signal Ss) becomes a certain amplitude (in the present embodiment, so that the amplitude is equal to the amplitude of the same-phase signal component that constructs the reference signal Sr1 inputted into the adder circuit 242 (i.e., the second signal component with the same frequency and the same phase as the standard signal Ss)). By doing so, the amplitude of the opposite-phase signal component that constructs the amplified detection signal S3 is set equal to the amplitude of the same-phase signal component of the reference signal Sr1 inputted into the adder circuit 242. Accordingly, as described above, the adder circuit 242 generates and outputs the output signal So composed of a signal component with the opposite phase to the voltage signal S4, a signal component with the same phase as the AC voltage V1 (the two signal components mentioned above that construct the amplified detection signal S3), and the signal component with the same phase as the voltage signal S4 (the signal component mentioned above that constructs the reference signal Sr1).

Here, in accordance with the magnitude of the capacitance C0 formed between the detected object 4 and the detection electrode 212, the standard current component Is1 and the measured current component Iv1 included in the current signal I will vary with the same proportions and the standard voltage component Vs1 and the measured voltage component Vv1 included in the detection signal S1 will also vary with the same proportions. Accordingly, although both the opposite-phase signal component that constructs the amplified detection signal S3 (a signal component with the same frequency as the standard signal Ss) and the signal component with the same frequency as the AC voltage V1 will vary with the same proportions, in the signal extracting unit 232, due to the feedback control described above, the amplified detection signal S3 is generated by the amplifier circuit 241 so that the amplitude of the opposite-phase signal component (first signal component) that constructs the signal S3 matches the amplitude of the same-phase signal component (second signal component) that constructs the reference signal Sr1. For this reason, in the construction of the present embodiment, the voltage components based on the measured current component Iv1 included in the output signal So, that is, the signal components that construct the amplified detection signal S3 (the signal component with opposite phase to the voltage signal S4 and the signal component with the same phase as the AC voltage V1) will have an amplitude whose magnitude corresponds to the difference between the AC voltage V1 generated by the detected object 4 and the voltage signal S4 regardless of the magnitude of the capacitance C0. The signal component that has the same phase as the voltage signal V4 that constructs the reference signal Sr1 included in the output signal So is fundamentally a signal component that is generated irrespective of the magnitude of the capacitance C0. Accordingly, the output signal So is a signal that is unaffected by the magnitude of the capacitance C0.

The feedback control unit (voltage generating circuit) 237 inputs and amplifies the insulated detection signal S2 to generate the voltage signal S4 of the voltage V4 (feedback voltage), and outputs (applies) the voltage signal S4 to the guard electrode 211. Here, together with the guard electrode 211, the detection electrode 212, the detection unit 214, and the insulating unit 215 of the floating circuit unit 2D, the feedback control unit 237 forms a feedback loop and generates the voltage signal S4 by carrying out an amplification operation that amplifies the insulated detection signal S2 so that the potential difference Vdi between the AC voltage V1 and the voltage Vr of the guard electrode 211 falls. In the present embodiment, as one example, the feedback control unit 237 includes an AC amplifier circuit 237a, a phase compensating circuit 237b, and a booster circuit 237c. Here, the AC amplifier circuit 237a inputs and amplifies the insulated detection signal S2 to generate the voltage signal V4a. In this case, the AC amplifier circuit 237a carries out an amplification operation on the voltage signal V4a so that the absolute value of the voltage thereof changes in accordance with increases and decreases in the absolute value of the voltage of the insulated detection signal S2.

To stabilize the feedback control operation (by preventing vibration), the phase compensating circuit 237b inputs the voltage signal V4a, adjusts the phase of the voltage signal V4a, and outputs the result as the voltage signal V4b. The booster circuit 237c is constructed using a boosting transformer, for example, and by boosting the voltage signal V4b by a predetermined gain (i.e., by increasing the absolute value without changing the polarity), generates the voltage signal S4, and outputs the voltage signal S4 to the guard electrode 211. Also, the output impedance of the booster circuit 237c is set at a high impedance. The feedback control unit 237 constructed in this way generates and outputs the voltage signal S4 whose amplitude changes with the frequency characteristics shown in FIG. 16. Due to these frequency characteristics, for the case of a signal (the AC voltage V1) of a frequency in the low frequency band W1 out of the frequency bands W1, W2 covered by the response of the feedback control unit 237, the feedback control unit 237 will favorably follow the signal and will therefore generate and output a voltage signal S4 of the same voltage V4 as the AC voltage V1. However, for the case of a signal (the AC voltage V1) of a frequency included in the high frequency band W2 out of the frequency bands W1, W2 covered by the response of the feedback control unit 237, due to insufficient gain, the feedback control unit 237 will generate and output a voltage signal S4 of the voltage V4 that is below the AC voltage V1. The feedback control unit 237 will also generate and output a voltage signal S4 whose voltage V4 is substantially zero volts for signals (including the standard signal Ss) in a frequency band W3 that exceeds the frequency band W2 without following such signals.

The processing unit 233 includes an A/D converter and a CPU (neither of which is shown), and carries out a storage process that samples the voltage waveform (level) of the output signal So using a sampling clock of a predetermined frequency to convert the waveform to digital data D1 and stores the digital data D1 in the storage unit 234, a voltage calculating process that calculates the AC voltage V1 based on the digital data D1, and an output process that outputs the calculated AC voltage V1. The storage unit 234 is constructed of a ROM, a RAM, or the like, and stores in advance a voltage calculation table TB used in the voltage calculating process carried out by the processing unit 233. An overview of a generation procedure for the voltage calculation table TB will now be described. As one example, in a state where a standard signal Ss with a known voltage Vs (a certain voltage) is being outputted to the guard electrode 211 and feedback control is being carried out by the synchronous detection circuit 243 and the control circuit 244, the amplitude of the AC voltage V1 generated in the detected object 4 is converted in predetermined voltage steps to obtain the digital data D1, and in association with the AC voltage V1 that changes in the voltage steps, the digital data D1 is stored together with the voltage value of the AC voltage V1 to generate the voltage calculation table TB. With this construction, by referring to the voltage calculation table TB to obtain the voltage value of the AC voltage V1 that corresponds to the obtained digital data D1, the processing unit 233 can calculate the AC voltage V1 of the detected object 4. As one example in the present embodiment, the output unit 235 is constructed of a display apparatus, and in the output process carried out by the processing unit 233, displays the waveform of the AC voltage V1 and/or calculated voltage parameters (amplitude, effective value, or the like).

Next, a detection operation carried out on the AC voltage V1 of the detected object 4 by the voltage detecting apparatus 201 will now be described.

First, the floating circuit unit 2D (or the entire voltage detecting apparatus 201) is positioned near the detected object 4 so that the detection electrode 22 faces but does not contact the detected object 4. By doing so, as shown in FIG. 13, the capacitance C0 is formed between the detection electrode 212 and the detected object 4. Here, although the value of the capacitance C0 will change inversely proportionally to the distance between the detection electrode 212 and the detected object 4, once the floating circuit unit 2D has been initially disposed, such capacitance C0 will be a constant (i.e., non-varying) value so long as the environmental conditions, such as temperature, are constant. Since the value of the capacitance C0 is normally extremely small (for example, a range of several pF to around several tens of pF or so), even if the frequency of the AC voltage V1 is around several hundred Hz, the impedance between the detected object 4 and the detection electrode 212 will be sufficiently large (several MΩ). For this reason, in the voltage detecting apparatus 201, even when the AC voltage V1 of the detected object 4 and the voltage Vr of the guard electrode 211 greatly differ (i.e., when the potential difference Vdi is large), it will still be possible to use a low-cost component with a low input withstand voltage in the operational amplifier 221a that constructs the detection unit 214. Even when this construction is used, breakdown of the operational amplifier 221a due to the potential difference Vdi is avoided.

By producing an AC connection between the detection electrode 212 and the detected object 4 via the capacitance C0, a current path A (i.e., the current path shown by the dot-dash line in FIG. 13) from the ground potential Vg via the detected object 4, the detection electrode 212, the detection unit 214, the guard electrode 211, the capacitor 231a, the standard signal outputting unit 231, and the feedback control unit 237, to the ground potential Vg is formed. This means that when the floating circuit unit 2D and the main circuit unit 3C are operating, a current signal I composed of the standard current component Is1 due to the voltage Vs of the standard signal Ss, the measured current component Iv1 due to the AC voltage V1 of the detected object 4 and the FB current component Ib1 due to the voltage V4 of the voltage signal S4 outputted from the feedback control unit 237 to the guard electrode 211 will flow on the current path A.

With this construction, in the floating circuit unit 2D, as shown in FIGS. 13, 14, the integrating circuit 221 of the detection unit 214 integrates the current signal I to generate the voltage signal S0 and the amplifier circuit 222 amplifies the voltage signal S0 and outputs the result as the detection signal S1. The insulating unit 215 inputs the detection signal S1 and outputs the insulated detection signal S2 that is electrically insulated from the detection signal S1.

In the main circuit unit 3C, the feedback control unit 237 generates the voltage signal S4 based on the insulated detection signal S2 and outputs the voltage signal S4 to the guard electrode 211. In this case, the feedback control unit 237 generates the voltage signal S4 whose amplitude changes with the frequency characteristics shown in FIG. 16 (that is, the voltage signal S4 whose amplitude is the same as the AC voltage V1 in the low frequency band W1, whose amplitude is virtually zero in the high frequency band W3, and whose amplitude gradually decreases from the same state as the AC voltage V1 toward zero as the frequency rises in an intermediate frequency band W2) and outputs the voltage signal S4 to the guard electrode 211. The amplitude converting unit 236 inputs the voltage Vr (a composite voltage composed of the voltage V4 of the voltage signal S4 and the voltage Vs of the standard signal Ss) generated in the guard electrode 211 as the voltage signal Sr, changes the amplitude of the voltage Vr (by k times), and outputs the result as the reference signal Sr1 with the frequency characteristics shown in FIG. 17.

Figure 16:
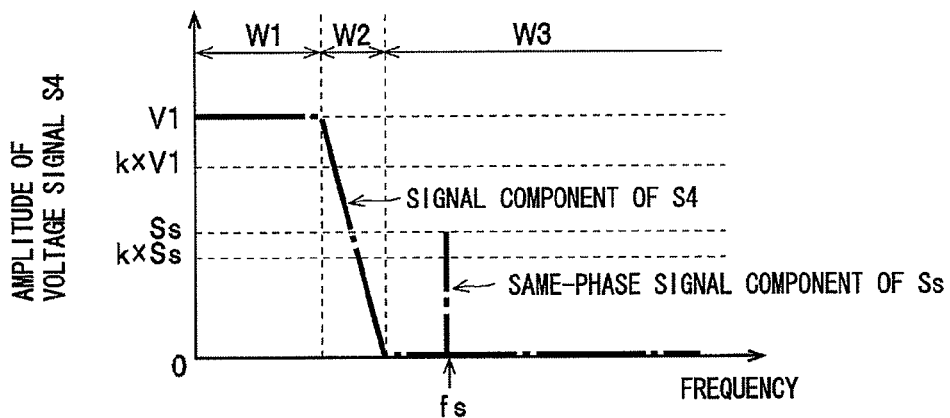
FIG. 16 is a frequency characteristics graph of a voltage signal.
Figure 18:
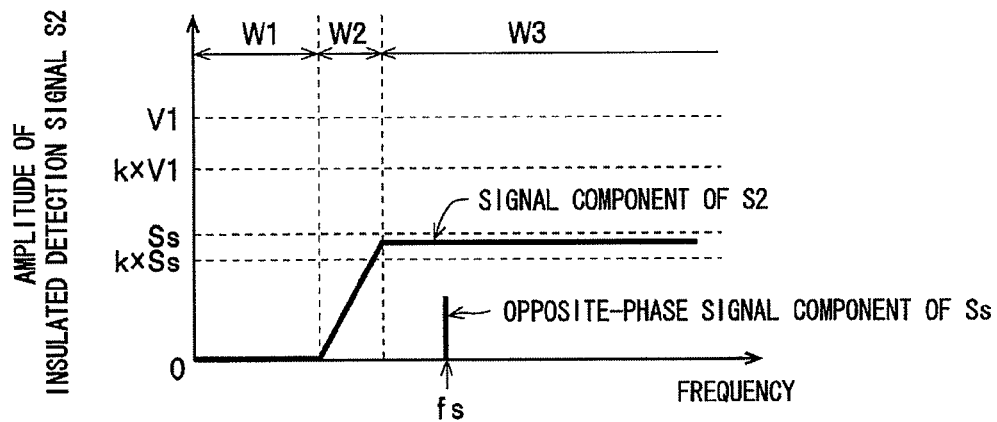
FIG. 18 is a frequency characteristics graph of an insulated detection signal outputted from a floating circuit unit of the third voltage detecting apparatus.

Since the feedback control unit 237 operates as described above and generates the voltage signal S4 with the frequency characteristics shown in FIG. 16 and outputs the voltage signal S4 to the guard electrode 211, the insulated detection signal S2 generated by the floating circuit unit 2D as described above based on the potential difference Vdi between the AC voltage V1 and such voltage signal S4 will be a signal where the signal components for the AC voltage V1 and the voltage signal S4 (i.e., components with the same frequency as the AC voltage V1) have an amplitude that changes with opposite frequency characteristics (see FIG. 18) to the frequency characteristics of the voltage signal S4 (see FIG. 16. That is, as shown in FIG. 18, the floating circuit unit 2D generates and outputs the insulated detection signal S2 so that in the low frequency band W1, since the feedback control is carried out to make the voltage V4 of the voltage signal S4 equal to the AC voltage V1 and thereby make the potential difference Vdi zero, the amplitude of the insulated detection signal S2 becomes zero, in the high frequency band W3, since the voltage V4 of the voltage signal S4 becomes substantially zero and the potential difference Vdi becomes equal to the AC voltage V1, the insulated detection signal S2 has an amplitude in proportion to the AC voltage V1, and in the intermediate frequency band W2, the insulated detection signal S2 has an amplitude that gradually increases in keeping with a rise in frequency from a zero state toward the amplitude in the frequency band W3.

As described earlier, in the signal extracting unit 232, feedback control is carried out by the synchronous detection circuit 243 and the control circuit 244 on the gain (amplification ratio) of the amplifier circuit 241 and the control circuit 244 controls the gain of the amplifier circuit 241 based on the wave detection signal Vd so that the amplitude of the opposite-phase signal component that constructs the amplified detection signal S3 (the first signal component that has the same frequency as but the opposite phase to the standard signal Ss) becomes a certain amplitude (i.e., in the present embodiment, so as to have the same amplitude as the amplitude of the same-phase signal component that constructs the reference signal Sr1 inputted into the adder circuit 242 (the second signal component that has the same frequency and the same phase as the standard signal Ss)). By doing so, the amplifier circuit 241 generates and outputs the amplified detection signal S3 that has the frequency characteristics shown in FIG. 19 and where the amplitude of the opposite-phase signal component matches the amplitude of the same-phase signal component of the reference signal Sr1 inputted into the adder circuit 242. In this case, as shown in FIG. 19, the amplitude of the amplified detection signal S3 in the frequency band W3 is k times the AC voltage V1, which as shown in FIG. 17 matches the amplitude (i.e., k times the AC voltage V1) of the reference signal Sr1 in the frequency band W1.

Figure 17:
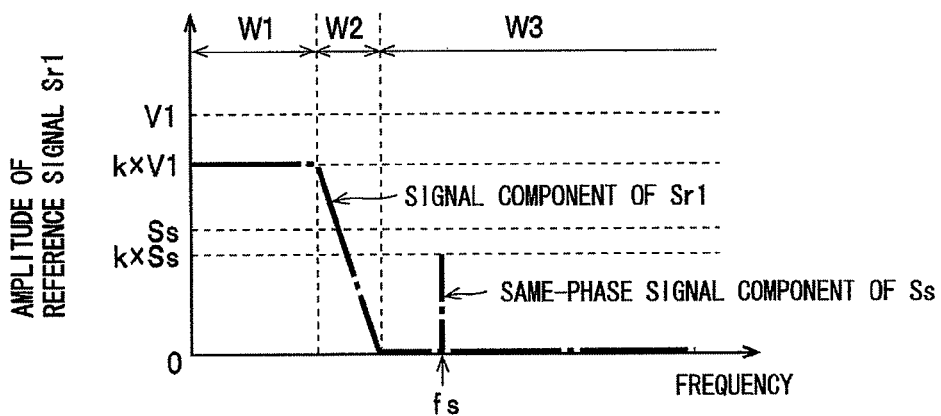
FIG. 17 is a frequency characteristics graph of a reference signal.
Figure 19:
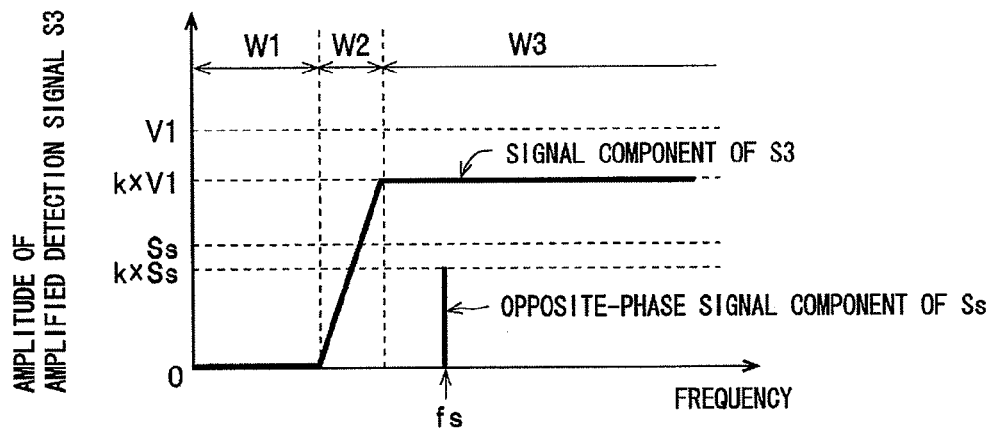
FIG. 19 is a frequency characteristics graph of an amplified detection signal generated by the amplifier circuit.
Figure 20:
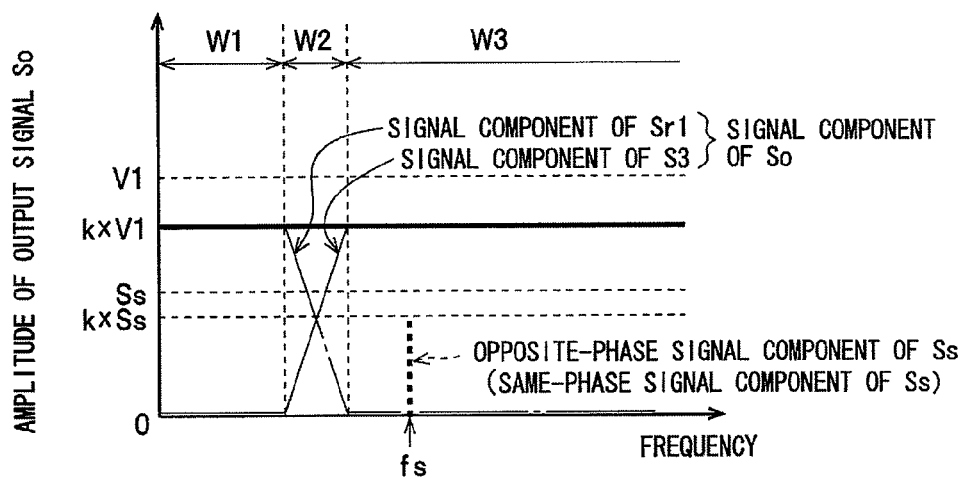
FIG. 20 is a frequency characteristics graph of an output signal.

Accordingly, as shown in FIG. 20, by adding the amplified detection signal S3 (a signal composed of a signal component with opposite phase to the voltage signal S4 and a signal component with the same phase as the AC voltage V1) with the frequency characteristics shown in FIG. 19 described above (the characteristics shown by the narrow solid line in FIG. 20) to the reference signal Sr1 (a signal composed of a signal component with the same phase as the voltage signal S4) with the frequency characteristics shown in FIG. 17 described above (the characteristics shown by the dot-dash line in FIG. 20), the adder circuit 242 generates and outputs the output signal So (a signal whose amplitude is k times the amplitude of the AC voltage V1 across a wide band) that is composed of only a signal component with the same phase as the AC voltage V1 and has flat frequency characteristics (the characteristics shown by the thick solid line in FIG. 20) across a wide frequency band from the low frequency band W1 to the high frequency band W3. In this case, as shown by the broken line in FIG. 20, the signal components of the standard signal Ss included in the amplified detection signal S3 and the reference signal Sr1 have matching amplitudes and therefore cancel each other out.

Next, the processing unit 233 carries out the storage process to input the output signal So, convert the output signal So to the digital data D1, and store the digital data D1 in the storage unit 234. After this, the processing unit 233 carries out the voltage calculating process. In this voltage calculating process, the processing unit 233 reads the digital data D1 stored in the storage unit 234 and refers to the voltage calculation table TB to obtain the AC voltage V1 corresponding to the read digital data D1. Also, the processing unit 233 calculates the effective value, amplitude, and the like of the AC voltage V1 based on the obtained AC voltage V1 and stores such information in the storage unit 234. The processing unit 233 finally carries out the output process and causes the output unit 235, which is constructed of a display apparatus, to display the effective value, amplitude, and the like of the AC voltage V1 that are stored in the storage unit 234. By doing so, the detection of the AC voltage V1 of the detected object 4 by the voltage detecting apparatus 201 is completed. Note that it is also possible to use a construction where in the output process, the processing unit 233 causes the output unit 235 to display the voltage waveform of the AC voltage V1 based on the obtained AC voltage V1.

In the voltage detecting apparatus 201, the standard signal outputting unit 231 outputs the standard signal Ss to the guard electrode 211, the detection unit 214 that operates on being supplied with the floating voltage (the plus voltage Vf+ and the minus voltage Vf−) outputs the detection signal S1 whose amplitude changes in accordance with the AC potential difference (V1−Vr) based on the current signal I flowing with a current value corresponding to the AC potential difference (V1−Vr) between the AC voltage V1 and the voltage Vr of the guard electrode 211 between the detected object 4 and the guard electrode 211 via the detection electrode 212, and the insulating unit 215 inputs the detection signal S1 and outputs the detection signal S1 as the insulated detection signal S2. Based on the insulated detection signal S2, the feedback control unit 237 generates the voltage signal S4 (with the voltage V4) so as to follow the AC voltage V1 and outputs the voltage signal S4 to the guard electrode 211. The signal extracting unit 232 controls the gain for the insulated detection signal S2, changes the amplitude of the amplified detection signal S3 and outputs the amplified detection signal S3 so that the amplitude of the first signal component of the standard signal Ss included in the amplified detection signal S3 matches the amplitude of the second signal component of the standard signal Ss included in the reference signal Sr1, and the signal extracting unit 232 adds the amplified detection signal S3 whose amplitude has been changed in this way and the reference signal Sr1. By doing so, the signal extracting unit 232 generates the signal component of the AC voltage V1 from which the signal components of the standard signal Ss (i.e., signal components with the same frequency as the standard signal Ss) have been removed and outputs such signal component as the output signal So, and the processing unit 233 detects and calculates the AC voltage V1 based on the level of the output signal So composed of the signal component of the AC voltage V1.

According to the voltage detecting apparatus 201, since the AC voltage V1 in a high frequency band that cannot be detected by the detection operation by the feedback control unit 237 alone can be detected based on the amplified detection signal S3 generated by the signal extracting unit 232, it is possible to detect the AC voltage V1 in a non-contact manner over a wide frequency band. That is, the voltage detecting apparatus 201 solves the third problem described above and therefore achieves the third object described above. Also, according to the voltage detecting apparatus 201, since the output signal So can be detected as a signal that is unaffected by the coupling capacitance (the capacitance C0) between the detected object 4 and the detection electrode 212, it is possible to detect the AC voltage V1 in a non-contact manner without calculating the capacitance C0.

Also, in the voltage detecting apparatus 201, in the signal extracting unit 232, the synchronous detection circuit 243 detects the wave detection signal Vd showing the amplitude of the signal component of the standard signal Ss included in the amplified detection signal S3 or the output signal So by carrying out synchronous detection using the standard signal Ss and the control circuit 244 controls the gain of the amplifier circuit 241 based on the wave detection signal Vd. Therefore, according to the voltage detecting apparatus 201, it is possible to accurately detect the signal component of the standard signal Ss by carrying out synchronous detection, and by doing so, it is possible to set the amplitude of the first signal component of the standard signal Ss included in the amplified detection signal S3 equal to the amplitude of the second signal component of the standard signal Ss included in the reference signal Sr1 with high precision. As a result, it is possible to have the first signal component and the second signal component cancel one another out with high precision, and since this greatly reduces the signal component of the standard signal Ss included in the output signal So, it becomes possible to significantly improve the detection precision of the AC voltage V1.

Also, in the voltage detecting apparatus 201, the signal extracting unit 232 includes, as a canceling circuit, the adder circuit 242 that carries out a process that cancels out the first signal component (opposite-phase signal component) that constructs the amplified detection signal S3 and has opposite phase to the standard signal Ss and the second signal component that is included in the reference signal Sr1 and the same phase as the standard signal Ss, and the control circuit 244 controls the gain of the amplifier circuit 241 so that the first signal component included in the amplified detection signal S3 inputted into the adder circuit 242 can be cancelled out by the second signal component included in the reference signal Sr1. Therefore according to the voltage detecting apparatus 201, since it is possible to construct a canceling circuit from a simple circuit such as an adder circuit, it is possible to reliably generate the output signal So while simplifying the apparatus construction.

Also according to the voltage detecting apparatus 201, by including the processing unit 233 that detects the AC voltage V1 based on the output signal So, it is possible to cause the processing unit 233 to detect the AC voltage V1 at fixed intervals and store and save the detected AC voltages V1 in the storage unit 234 and to cause the output unit 235 to display the voltage waveform of the AC voltage V1 based on the AC voltages V1 stored in the storage unit 234.

Also, according to the voltage detecting apparatus 201, since the processing unit 233 calculates the voltage value of the AC voltage V1 based on the output signal So, it is possible to detect (measure) the AC voltage V1.

According to the voltage detecting apparatus 201, by changing the amplitude k times using the amplitude converting unit 236, it is possible to increase the range of the AC voltage V1 that can be detected. For example, even when the processing unit 233 has a rated input level for the output signal So (for a construction equipped with an A/D converter as described above, when the input level of the output signal So is limited to a predetermined level or below by the rated input of the A/D converter), by setting the multiplier k at the numerical value $1/10$, compared to the numerical value 1 (i.e., a construction where the standard signal Ss is directly inputted into the adder circuit 242), it is possible to detect (measure) an AC voltage V1 of a higher voltage while still satisfying the rated input level for the output signal So.

Note that although the voltage detecting apparatus 201 described above is constructed to use the fact that the first signal component for the standard signal Ss included in the amplified detection signal S3 has opposite phase to the second signal component for the standard signal Ss included in the reference signal Sr1 and to use the adder circuit 242 as a canceling circuit so that the first signal component included in the amplified detection signal S3 and the second signal component included in the reference signal Sr1 cancel each other out, it is also possible to cause the detection unit 214, the insulating unit 215, and the amplifier circuit 241 to invert the phase of the detection signal S1, the insulated detection signal S2, and the amplified detection signal S3 and/or to invert the phase of the reference signal Sr1 outputted to the canceling circuit. With this construction, since it is possible to make the phase of the first and second signal components for the standard signal Ss inputted into the adder circuit 242 equal, by using a subtractor circuit as the canceling circuit, it is possible to cancel out the first signal component included in the amplified detection signal S3 and the second signal component included in the reference signal Sr1.

Also, in the example described above, although a construction is used where the voltage Vr of the guard electrode 211 is set as the voltage signal Sr and the amplitude of the voltage signal Sr is changed by the amplitude converting unit 236 and inputted into the canceling circuit (in the above example, the adder circuit 242) as the reference signal Sr1, it is also possible to apply the present invention to a construction where the amplitude converting unit 236 is omitted and the voltage signal Sr is inputted into the canceling circuit as the reference signal. With this construction, the signal extracting unit 232 carries out feedback control to make the amplitude of the first signal component of the standard signal Ss included in the amplified detection signal S3 match the amplitude of the second signal component of the standard signal Ss included in the voltage signal Sr as the reference signal. Accordingly, in this construction, the amplitude of the voltage component is detected in a state one time the amplitude (that is, an equal voltage to the AC voltage V1) based on the measured current component Iv1 included in the output signal So. This means the processing unit 233 is capable of directly detecting the AC voltage V1 from the voltage component based on the detected measured current component Iv1.

Also, in the voltage detecting apparatus 201 described above, although a construction is used where the insulating unit 215 and the amplifier circuit 241 are directly interconnected, the standard signal outputting unit 231 and the adder circuit 242 are directly interconnected, and the standard signal outputting unit 231 and the synchronous detection circuit 243 are directly interconnected, though not shown, it is also possible to provide a buffer between such components as necessary. Also, although an example has been described above where the standard signal Ss outputted from the standard signal outputting unit 231 is supplied to the synchronous detection circuit 243 with its level unchanged, though not shown, it is also possible to use an attenuator constructed of voltage-dividing resistors, for example, to lower the standard signal Ss to a required level and supply the result to the synchronous detection circuit 243.

Also, although not shown, by equipping inside the main circuit unit 3C with an A/D converting unit that converts the insulated detection signal S2, which is an analog signal, to digital data and an A/D converting unit that converts the standard signal Ss, which is also an analog signal, supplied from the standard signal outputting unit 231 to the signal extracting unit 232, it is possible to carry out all of the processing by the signal extracting unit 232 as digital processing. In such case, it is also possible to use a construction where the processing unit 233 is equipped with the functions of the signal extracting unit 232, and by using this construction, it is possible to greatly reduce the number of circuit components. The functions of the processing unit 233 and the functions of the signal extracting unit 232 may be realized by software, or may be realized by hardware (such as a DSP (Digital Signal Processor) or a logic array).

Next, a line voltage detecting apparatus (a third line voltage detecting apparatus) 251 that uses a plurality of the voltage detecting apparatuses 201 described above will be described.

First, the line voltage detecting apparatus 251 will be described with reference to the drawings. Note that an example where line voltages of a three-phase (R phase, S phase, and T phase), three-wire AC paths (hereinafter simply "paths") R, S, T are detected will be described.

Figure 21:
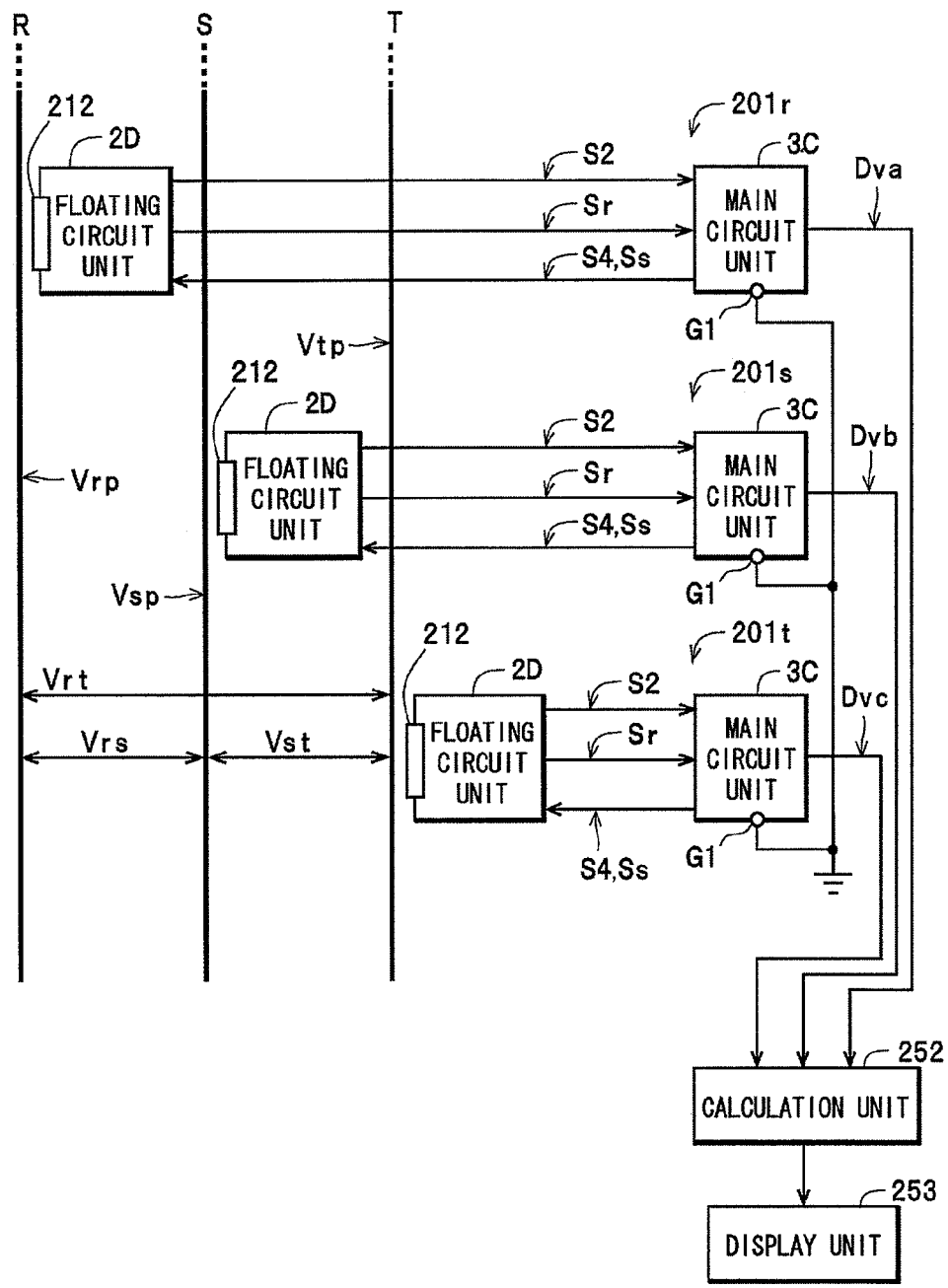
FIG. 21 is a block diagram of a third line voltage detecting apparatus that uses the third voltage detecting apparatus.

As one example, as shown in FIG. 21, the line voltage detecting apparatus 251 includes an equal number of (here, three) voltage detecting apparatuses 201 to the number of paths R, S, T (hereinafter, the voltage detecting apparatuses 201 are referred to individually as the voltage detecting apparatuses 201r, 201s, 201t corresponding to the paths R, S, T and as the "voltage detecting apparatuses 201" when no special distinction is required), a calculation unit 252, and a display unit 253, and is constructed so as to be capable of detecting a line voltage Vrs between the paths R, S, a line voltage Vst between the paths S, T, and a line voltage Vrt between the paths R, T in a non-contact manner.

As shown in FIG. 21, the respective voltage detecting apparatuses 201 are constructed in the same way with the floating circuit unit 2D and the main circuit unit 3C described above and, with the paths R, S, T as the detected objects, detect the effective values of the AC voltages Vrp, Vsp, Vtp (the detected AC voltages) and output data showing the effective values as detection data Dva, Dvb, Dvc. Hereinafter, when no special distinction is required, the voltage data Dva, Dvb, Dvc are collectively referred to as the "detection data Dv". In the present embodiment, the output unit 235 of each voltage detecting apparatus 201 is constructed of a transmission apparatus that is capable of data transmission and equipped with a function that transmits the detection data Dva, Dvb, Dvc inputted from the processing unit 233 to the calculation unit 252. Note that since the other component elements aside from the output unit 235 of the voltage detecting apparatus 201 are the same as in the constructions described earlier, detailed description thereof is omitted.

The calculation unit 252 includes a CPU and a memory (neither of which is shown), and carries out a line voltage calculating process that calculates (detects) the line voltages based on the detection data Dv outputted from the respective voltage detecting apparatuses 201. The calculation unit 252 displays the result of the line voltage calculating process on the display unit 253. In the present embodiment, the display unit 253 is constructed of a monitor apparatus such as a liquid crystal display. Note that it is also possible to construct the display unit 253 of a print apparatus such as a printer. Also, as described later, the parts (for example, the respective cases of the main circuit units 3C) G1 of the main circuit units 3C of the respective voltage detecting apparatuses 201 that are used as the ground potential Vg are connected together. Also, as one example, the calculation unit 252 and the display unit 253 operate by being supplied with a voltage from a power supply circuit (not shown) included in one main circuit unit 3C out of the three main circuit units 3C.

Next, a detection operation by the line voltage detecting apparatus 251 will be described.

First, during detection, as shown in FIG. 21, to detect the AC voltage Vrp of the path R using the voltage detecting apparatus 201r, the floating circuit unit 2D of the voltage detecting apparatus 201r is positioned near the path R and the detection electrode 212 of the voltage detecting apparatus 201r is positioned opposite the corresponding path R. In the same way, to detect the AC voltages Vsp, Vtp of the paths S, T, the detection electrodes 212 of the respective floating circuit units 2D of the voltage detecting apparatuses 201s, 201t are positioned opposite the corresponding paths S, T. By doing so, the capacitance C0 (see FIG. 13) is formed between each of the respective detection electrodes 212 and the paths R, S, T and the voltage detecting apparatuses 201r, 201s, 201t start detecting the AC voltages Vrp, Vsp, Vtp of the corresponding paths R, S, T. Here, as described earlier, in the voltage detecting apparatuses 201r, 201s, 201t, the AC voltages Vrp, Vsp, Vtp are accurately detected by the processing units 233 regardless of the magnitudes of the capacitances C0.

Here, in the respective voltage detecting apparatuses 201r, 201s, 201t, the output units 235 output the effective values of the AC voltages Vrp, Vsp, Vtp of the paths R, S, T calculated by the respective processing units 233 as the detection data Dva, Dvb, Dvc.

The calculation unit 252 inputs the detection data Dva, Dvb, Dvc outputted from the respective voltage detecting apparatuses 201 and stores the detection data Dva, Dvb, Dvc in the memory. Next, the calculation unit 252 carries out the line voltage calculating process. More specifically, the calculation unit 252 calculates the voltage difference between the effective values of the AC voltages Vrp, Vsp shown by the detection data Dva, Dvb to find (detect) the line voltage Vrs between the paths R, S. In the same way, the calculation unit 252 calculates the voltage difference between the effective values of the AC voltages Vsp, Vtp shown by the detection data Dvb, Dvc to find (detect) the line voltage Vst between the paths S, T and calculates the voltage difference between the effective values of the AC voltages Vrp, Vtp shown by the voltage data Dva, Dvc to find (detect) the line voltage Vrt between the paths R, T. The calculation unit 252 also has the calculated line voltages Vrs, Vst, Vrt displayed on the display unit 253.

In this way, according to the line voltage detecting apparatus 251, by using the voltage detecting apparatuses 201, even if the coupled capacitances (the capacitances C0) between the detection electrodes 212 of the respective voltage detecting apparatuses 201 and the respective paths R, S, T as the detected objects for the voltage detecting apparatuses 201 are unknown, it will still be possible to accurately detect the line voltages Vrs, Vst, Vrt across a wide frequency band in a non-contact manner without calculating the coupled capacitances.

It is also possible to construct the voltage detecting apparatus 201 so as to be equipped with a self-diagnosis function that detects the level of the signal component of the standard signal Ss (a signal component with the same frequency as the standard signal Ss) included in one signal out of the insulated detection signal S2 and the amplified detection signal S3 and judges (diagnoses) whether the apparatus is operating normally. More specifically, for an example where the insulated detection signal S2 is used, as shown by the broken line in FIG. 13, a filter (band pass filter) 238 that passes a signal component with the same frequency as the standard signal Ss is provided and by inputting the insulated detection signal S2 detected at the point A into the filter 238, the signal component of the standard signal Ss included in the insulated detection signal S2 is extracted and outputted to the processing unit 233. The processing unit 233 functions as a judging unit, and converts the signal component of the inputted standard signal Ss to digital data, detects the level (the amplitude level of the signal component or a DC voltage level (an absolute value of a DC voltage) after rectification of such signal component) and compares the level with a set level set in advance to carry out self-diagnosis.

Here, in the voltage detecting apparatus 201 when the detection electrode 212 and the detected object 4 are capacitively coupled in a state where the apparatus is operating normally, the current signal I (more specifically, the standard current component Is1) due to the standard signal Ss outputted from the standard signal outputting unit 231 will flow between the detected object 4 and the floating circuit unit 2D and a signal component due to the standard current component Is1 will always be included in the insulated detection signal S2 and the amplified detection signal S3. Accordingly, by setting the level of the standard signal Ss included in the insulated detection signal S2 in this state as the set level in advance, self-diagnosis on the voltage detecting apparatus 201 can be realized by the processing unit 233 carrying out at least one process out of a judging process that judges that the apparatus is operating normally (a state called "normal operation") when the detected level of the signal component of the standard signal Ss is equal to or greater than the set level and a judging process that judges that the apparatus is operating abnormally (a state called "abnormal operation") when the detected level of the signal component of the standard signal Ss is below the set level. It is also possible to use a construction where the processing unit 233 outputs the result of the self-diagnosis to the output unit 235 and by doing so, it is possible to inform the outside whether the apparatus is operating normally. It is also possible to use a construction where the processing unit 233 stores the result of the self-diagnosis in the storage unit 234 so that by confirming the stored result of the self-diagnosis, it is possible to detect whether the apparatus is operating normally (or in other words, whether an error has occurred). It is also possible to use a construction where the amplified detection signal S3 detected at the point B is inputted into the filter 238 in place of the insulated detection signal S2, and with such construction also, it is possible to realize self-diagnosis in the same way as in the construction described above that uses the insulated detection signal S2.

As a construction for carrying out self-diagnosis, it is also possible for the voltage detecting apparatus 201 to use a construction that detects one level out of a level of the signal component of the standard signal Ss included in the output signal So (the amplitude level of such signal component or a DC voltage level (an absolute value of a DC voltage) after rectification of such signal component) and a level of the wave detection signal Vd (an absolute value of a DC voltage) and carries out self diagnosis based on the detected level. More specifically, when the output signal So is used as one example, in place of the construction shown by the broken line in FIG. 13 (i.e., a construction where the insulated detection signal S2 is inputted into the filter 238), a construction is used where the output signal So detected at the point C is inputted into the filter 238, and the signal component of the standard signal Ss included in the output signal So is extracted and outputted to the processing unit 233. The processing unit 233 functions as a judging unit, and converts the signal component of the inputted standard signal Ss to digital data, detects the level (the amplitude level or the DC voltage level) and compares the level with a set level set in advance to carry out self-diagnosis.

Here, when the voltage detecting apparatus 201 is operating normally, since the adder circuit 242 adds the amplified detection signal S3 and the reference signal Sr1 so that the signal components of the standard signal Ss included in the signals S3, Sr1 cancel each other out, the amplitude of the signal component of the standard signal Ss included in the output signal So will have an extremely low level. Accordingly, by setting in advance an upper limit value (a permitted maximum level) for the level (amplitude level or DC voltage level described above) of the signal component of the standard signal Ss included in the output signal So as a set level, self-diagnosis on the voltage detecting apparatus 201 can be realized by the processing unit 233 carrying out at least one process out of a judging process that judges that the apparatus is operating normally (a state called "normal operation") when the detected level of the signal component of the standard signal Ss is equal to or less than the set level and a judging process that judges that the apparatus is operating abnormally (a state called "abnormal operation") when the detected level of the signal component of the standard signal Ss is above the set level. It is also possible to use a construction where the processing unit 233 outputs the result of the self-diagnosis to the output unit 235 and by doing so, it is possible to inform the outside whether the apparatus is operating normally. It is also possible to use a construction where the processing unit 233 stores the result of the self-diagnosis in the storage unit 234 so that by confirming the stored result of the self-diagnosis, it is possible to detect whether the apparatus is operating normally (or in other words, whether an error has occurred). Also, in place of a construction that detects the level of the signal component of the standard signal Ss included in the output signal So, it is also possible to use a construction that uses the level of the wave detection signal Vd detected at the point D. With this construction, since the level of the wave detection signal Vd is a DC component generated due to only the signal component of the standard signal Ss, it is possible to omit the filter 238. With this construction also, in the same way as the above construction that uses the level of the signal component of the standard signal Ss included in the output signal So, by comparing the level (an absolute value of a DC voltage) of the wave detection signal Vd to a set level set in advance for such level, it is possible to carry out self-diagnosis.

Also, although a construction has been described where the processing unit 233 compares a signal component of the standard signal Ss extracted from one signal out of the insulated detection signal S2, the amplified detection signal S3, and the output signal So, or the result of converting the wave detection signal Vd to digital data with a set level, when a construction is used where the extracted signal component of the standard signal Ss is rectified and converted to a DC voltage, it will also be possible to use a comparator to carry out the comparison with the set level. In the same way for the wave detection signal Vd also, it should be obvious that it is possible to use a construction where a comparator is used to carry out the comparison with the set level. Also, although the construction is simplified when the filter 238 is used to extract the signal component of the standard signal Ss from the insulated detection signal S2 or the amplified detection signal S3, it is also possible to use a construction that extracts the signal component by carrying out synchronous detection using the standard signal Ss.

What is claimed is:

1. A voltage detecting apparatus that detects a detected AC voltage generated in a detected object, comprising:
    a detection electrode that is disposed facing the detected object and is capacitively coupled to the detected object;
    a bootstrap circuit, which includes an operational amplifier that operates using a floating power supply generated with a reference voltage as a reference and has a non-inverted input terminal connected to the detection electrode, has the reference voltage applied to the non-inverted input terminal via two resistors that are connected in series, and has an inverted input terminal connected via a capacitor to the connection point of the two resistors, and which generates, based on a voltage generated at the detection electrode and the reference voltage, and outputs a detection signal whose amplitude changes in accordance with a potential difference between the detected AC voltage and the reference voltage;
    an insulating circuit that inputs the detection signal and outputs an insulated detection signal that is electrically insulated from the detection signal; and
    a voltage generating circuit that amplifies the insulated detection signal so as to reduce the potential difference and thereby generates the reference signal.

2. The voltage detecting apparatus according to claim 1, wherein the insulating circuit includes an optical insulating element and/or a transformer, and outputs the detection signal, which is an analog signal, so as to be electrically insulated from the input side thereof.

3. The voltage detecting apparatus according to claim 1, further comprising:
    a guard electrode set at the reference voltage, wherein the bootstrap circuit and a primary-side circuit of the insulating circuit are covered by the guard electrode.

4. The voltage detecting apparatus according to claim 3, wherein an opening is formed in the guard electrode and the detection electrode is disposed at a position inside the guard electrode so as to face the opening in a state where the detection electrode does not protrude from the opening.

5. The voltage detecting apparatus according to claim 1, further comprising:
    an insulator that covers an entire surface of the detection electrode that faces the detected object.

6. A line voltage detecting apparatus, comprising:
    a plurality of voltage detecting apparatuses according to claim 1 that are constructed so that the detection electrodes thereof are capable of being disposed facing a plurality of paths that correspond to the detected objects thereof and so as to be capable of detecting AC voltages generated on the respective paths as the detected AC voltages thereof; and
    a calculation unit that calculates a voltage difference between the AC voltages on two of the paths detected by a pair of voltage detecting apparatuses out of the plurality of voltage detecting apparatuses and thereby finds a line voltage between the two paths.

* * * * *